(12) United States Patent
Kim et al.

(10) Patent No.: US 12,159,939 B2
(45) Date of Patent: Dec. 3, 2024

(54) SEMICONDUCTOR DEVICE

(71) Applicant: Samsung Electronics Co., Ltd., Suwon-si (KR)

(72) Inventors: Munhyeon Kim, Hwaseong-si (KR); Doyoung Choi, Hwaseong-si (KR); Daewon Ha, Seoul (KR); Mingyu Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 407 days.

(21) Appl. No.: 17/724,619

(22) Filed: Apr. 20, 2022

(65) Prior Publication Data

US 2022/0399463 A1 Dec. 15, 2022

(30) Foreign Application Priority Data

Jun. 15, 2021 (KR) .................. 10-2021-0077659

(51) Int. Cl.
*H01L 29/786* (2006.01)
(52) U.S. Cl.
CPC .. *H01L 29/78618* (2013.01); *H01L 29/78696* (2013.01)
(58) Field of Classification Search
None
See application file for complete search history.

(56) References Cited

U.S. PATENT DOCUMENTS

| | | |
|---|---|---|
| 8,210,994 B2 | 7/2012 | Chang et al. |
| 10,056,254 B2 | 8/2018 | Balakrishnan et al. |
| 10,181,381 B2 | 1/2019 | Al-Hazmi et al. |
| 10,243,054 B1 | 3/2019 | Cheng et al. |
| 10,396,169 B2 | 8/2019 | Cheng et al. |
| 2018/0162732 A1 | 6/2018 | Li et al. |
| 2019/0287864 A1 | 9/2019 | Cheng et al. |
| 2020/0388705 A1 | 12/2020 | Choi et al. |

*Primary Examiner* — Anthony Ho
(74) *Attorney, Agent, or Firm* — HARNESS, DICKEY & PIERCE, P.L.C.

(57) ABSTRACT

A semiconductor device includes an active pattern on a substrate, a plurality of source/drain patterns in a first direction on the active pattern, a first channel structure between a pair of source/drain patterns, a second channel structure between another pair of source/drain patterns, a first gate electrode extending in a second direction perpendicular to the first direction, and a second gate electrode intersecting the second channel structure and extending in the second direction. The first gate electrode includes a first portion between a bottom surface of the first channel structure and a top surface of the active pattern, and the second gate electrode includes a first portion between a bottom surface of the second channel structure and the top surface of the active pattern. A thickness of the first portion of the second gate electrode is greater than a thickness of the first portion of the first gate electrode.

20 Claims, 26 Drawing Sheets

SEMICONDUCTOR DEVICE

CROSS-REFERENCE TO RELATED APPLICATION

This U.S. non-provisional patent application claims priority under 35 U.S.C. § 119 to Korean Patent Application No. 10-2021-0077659, filed on Jun. 15, 2021, in the Korean Intellectual Property Office, the disclosure of which is hereby incorporated by reference in its entirety.

BACKGROUND

Some example embodiments of inventive concepts relate to a semiconductor device and, more particularly, to a semiconductor device including a field effect transistor and/or a method of manufacturing the same.

Semiconductor devices may include integrated circuits including metal-oxide-semiconductor field effect transistors (MOSFETs). As sizes and/or design rules of semiconductor devices have been reduced, MOSFETs have been scaled down. Operating characteristics of semiconductor devices may be deteriorated by reduction in size of MOSFETs. Accordingly, various methods for forming semiconductor devices which have improved or excellent performance while overcoming limitations by the high integration have been studied.

SUMMARY

Some example embodiments of inventive concepts may provide a semiconductor device capable of improving electrical characteristics and reliability.

According to some example embodiments, a semiconductor device may include an active pattern on a substrate, a plurality of source/drain patterns on the active pattern and arranged in a first direction, a first channel structure between a pair of source/drain patterns of the plurality of source/drain patterns, a second channel structure between another pair of source/drain patterns of the plurality of source/drain patterns, a first gate electrode intersecting the first channel structure and extending in a second direction perpendicular to the first direction, and a second gate electrode intersecting the second channel structure and extending in the second direction. The first gate electrode may include a first portion between a bottom surface of the first channel structure and a top surface of the active pattern, and the second gate electrode may include a first portion between a bottom surface of the second channel structure and the top surface of the active pattern. A thickness of the first portion of the second gate electrode may be greater than a thickness of the first portion of the first gate electrode.

According to some example embodiments, a semiconductor device may include an active pattern on a substrate and extending in a first direction, a first channel structure comprising a plurality of semiconductor patterns vertically stacked on the active pattern, a second channel structure spaced apart from the first channel structure in the first direction on the active pattern, a source/drain pattern between the first channel structure and the second channel structure, a first gate electrode intersecting the first channel structure and extending in a second direction perpendicular to the first direction, and a second gate electrode intersecting the second channel structure and extending in the second direction. The second gate electrode may include a first portion between a bottom surface of the second channel structure and a top surface of the active pattern. A top surface of the first portion may be at a higher level than a top surface of a lowermost semiconductor pattern of the plurality of semiconductor patterns.

According to some example embodiments, a semiconductor device may include an active pattern on a substrate and extending in a first direction, a plurality of source/drain patterns on the active pattern and arranged in the first direction, a first channel structure between a pair of source/drain patterns of the plurality of source/drain patterns, the first channel structure comprising a plurality of semiconductor layers stacked vertically, a second channel structure between another pair of source/drain patterns of the plurality of source/drain patterns, the second channel structure comprising a plurality of semiconductor layers stacked vertically, a first gate electrode intersecting the first channel structure and extending in a second direction perpendicular to the first direction, a second gate electrode intersecting the second channel structure and extending in the second direction, a gate insulating layer between the first channel structure and the first gate electrode and between the second channel structure and the second gate electrode, gate capping patterns on top surfaces of the first and second gate electrodes, respectively, a first interlayer insulating layer on the gate capping patterns, active contacts penetrating the first interlayer insulating layer so as to be connected to the source/drain patterns, respectively, a second interlayer insulating layer on the first interlayer insulating layer, and interconnection lines provided in the second interlayer insulating layer and connected to the active contacts. A lowermost semiconductor layer of the semiconductor layers of the first channel structure may have a first length in the first direction. A lowermost semiconductor layer of the semiconductor layers of the second channel structure may have a second length in the first direction, which is less than the first length.

BRIEF DESCRIPTION OF THE DRAWINGS

Inventive concepts will become more apparent in view of the attached drawings and accompanying detailed description.

DETAILED DESCRIPTION OF EXAMPLE EMBODIMENTS

Some example embodiments of inventive concepts will be described hereinafter in detail with reference to the accompanying drawings.

Figure 1:
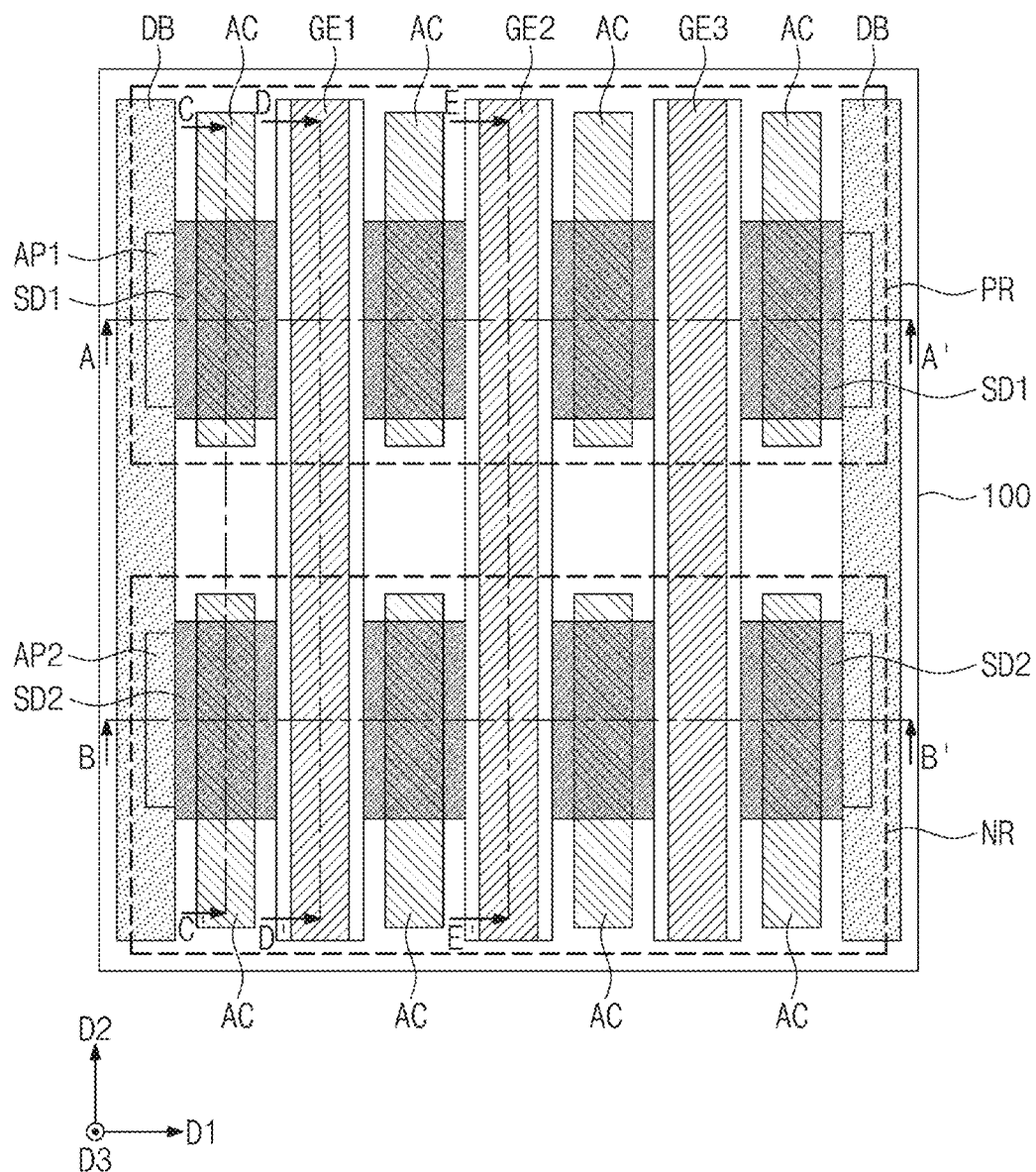
FIG. 1 is a plan view illustrating a semiconductor device according to some example embodiments of inventive concepts.

FIG. 1 is a plan view illustrating a semiconductor device according to some example embodiments of inventive concepts. FIGS. 2A to 2E are cross-sectional views taken along lines A-A', B-B', C-C', D-D' and E-E' of FIG. 1, respectively.

Referring to FIGS. 1 and 2A to 2E, a semiconductor device may include a substrate 100 including regions such as a PMOSFET region PR and an NMOSFET region NR. Transistors may be provided on and/or in and/or within each of the PMOSFET region PR and the NMOSFET region NR. The transistors may include source/drain patterns SD1 and SD2, channel structures CH1, CH2 and CH3, and gate electrodes GE1, GE2 and GE3.

In some example embodiments, the PMOSFET region PR and the NMOSFET region NR of the substrate 100 may be or may include or correspond to a logic cell region. In this case, the transistors may be logic transistors constituting or included in a logic circuit of the semiconductor device. In some example embodiments, the PMOSFET region PR and the NMOSFET region NR of the substrate 100 may be or may include or correspond to a memory cell region on which memory cells for storing data are formed. For example, the transistors may be memory cell transistors constituting or included in static random access memory (SRAM) cells.

The substrate 100 may be a semiconductor substrate including silicon, germanium, or silicon-germanium or may be a compound semiconductor substrate. Alternatively, the substrate 100 may be a silicon-on-insulator (SOI) substrate. The substrate 100 may be doped, e.g., may be lightly doped with p-type impurities; however, example embodiments are not limited thereto.

A first active pattern AP1 and a second active pattern AP2 may be provided on the substrate 100. The first active pattern AP1 and the second active pattern AP2 may extend in a first direction D1 parallel to a top surface and/or a bottom surface of the substrate 100. The first active pattern AP1 may be provided on the PMOSFET region PR. The second active pattern AP2 may be provided on the NMOSFET region NR spaced apart from the PMOSFET region PR in a second direction D2. The first active pattern AP1 and the second active pattern AP2 may be parallel to each other. The first and second active patterns AP1 and AP2 may vertically protrude in a direction away from the bottom surface of the substrate 100. The first active pattern AP1 and the second active pattern AP2 may be defined by a trench TR formed in an upper portion of the substrate 100. In some example embodiments, the first active pattern AP1 and the second active pattern AP2 may be portions of the substrate 100 and/or may be epitaxially grown on the substrate 100.

A device isolation layer ST may fill the trench TR. The device isolation layer ST may include a silicon oxide layer. The device isolation layer ST may not cover the channel structures CH1, CH2 and CH3 to be described later in detail.

A liner layer OLI may be disposed between the device isolation layer ST and the first and second active patterns AP1 and AP2. The liner layer OLI may cover or directly cover a sidewall of each of the first and second active patterns AP1 and AP2. For example, the liner layer OLI may directly cover a sidewall of the trench TR. The liner layer OLI may cover or directly cover a bottom surface of the trench TR. The liner layer OLI may include a silicon oxide layer. In some example embodiments, the liner layer OLI may be or include the same material as the device isolation layer ST, and an interface between the liner layer OLI and the device isolation layer ST may not be visible, e.g., may not be observed with a transmission electron microscope (TEM).

Referring to FIGS. 1, 2A, 2C, 2D and 2E, a plurality of first source/drain patterns SD1 may be provided on the first active pattern AP1 of the PMOSFET region PR. The first source/drain patterns SD1 may be arranged in the first direction DE The first source/drain patterns SD1 may be spaced apart from each other in the first direction DE The first source/drain patterns SD1 may be provided in/within first recesses RS1 formed on the first active pattern AP1. The first source/drain patterns SD1 may be epitaxial patterns formed by a selective epitaxial growth (SEG) process. The first source/drain patterns SD1 may include dopants having a first conductivity type (e.g., a P-type such as boron). The impurities may be incorporated in the first source/drain patterns SD1 during the SET process and/or may be implanted into the first source/drain patterns SD1. The first source/drain patterns SD1 may include a semiconductor element (e.g., SiGe) of which a lattice constant is greater than that of a semiconductor element of the substrate 100; however, example embodiments are not limited thereto.

The channel structures CH1, CH2 and CH3 of the PMOSFET region PR may be provided between the plurality of first source/drain patterns SD1. Each of the channel structures CH1, CH2 and CH3 may be disposed between a pair of the first source/drain patterns SD1 to receive compressive stress. At least one of the channel structures CH1, CH2 and CH3 may include a plurality of semiconductor layers (or semiconductor patterns) SP1, SP2 and SP3 stacked in a vertical direction (i.e., a third direction D3). Each of the plurality of semiconductor layers SP1, SP2 and SP3 may include at least one of silicon (Si), germanium (Ge), or silicon-germanium (SiGe). For example, each of the plurality of semiconductor layers SP1, SP2 and SP3 may include crystalline (e.g. single-crystalline) silicon.

The plurality of semiconductor layers SP1, SP2 and SP3 may include a first semiconductor layer SP1, a second semiconductor layer SP2, and a third semiconductor layer SP3, which are located at vertical levels different from each other. The first semiconductor layer SP1 may be located at the highest level among the plurality of semiconductor layers SP1, SP2 and SP3. The second semiconductor layer SP2 may be located at a level which is lower than the first semiconductor layer SP1 and higher than the third semiconductor layer SP3. The numbers of the semiconductor layers SP1, SP2 and SP3 of the channel structures CH1, CH2 and CH3 formed at different positions may be different from each other. Here, bottom surfaces of the channel structures CH1, CH2 and CH3 may be located at different levels. For example, bottom surfaces of lowermost semiconductor layers of the semiconductor layers SP1, SP2 and SP3 constituting/included in the channel structures CH1, CH2 and CH3 may be located at different levels.

For example, the channel structures CH1, CH2 and CH3 may include a first channel structure CH1, a second channel structure CH2, and a third channel structure CH3, which are arranged in the first direction D1. The first channel structure CH1, the second channel structure CH2, and the third channel structure CH3 may be spaced apart from each other in the first direction D1. The first channel structure CH1 may be provided between a pair of first source/drain patterns SD1, adjacent to each other in the first direction D1, of the plurality of first source/drain patterns SD1. The first channel structure CH1 may connect the pair of first source/drain patterns SD1. For example, the first channel structure CH1 may include three semiconductor layers SP1, SP2 and SP3. The first channel structure CH1 may include the first semiconductor layer SP1, the second semiconductor layer SP2, and the third semiconductor layer SP3. The third semiconductor layer SP3 of the first channel structure CH1 may be a lowermost semiconductor layer of the first channel structure CH1.

The second channel structure CH2 may be provided between another pair of first source/drain patterns SD1 of the plurality of first source/drain patterns SD1. The third channel structure CH3 may be provided between still another pair of first source/drain patterns SD1 of the plurality of first source/drain patterns SD1. The number of the semiconductor layers SP1 and SP2 included in the second channel structure CH2 may be less than the number of the semiconductor layers SP1, SP2 and SP3 included in the first channel structure CH1. For example, the second channel structure CH2 may include two semiconductor layers SP1 and SP2. The second channel structure CH2 may include the first semiconductor layer SP1 and the second semiconductor layer SP2. The second semiconductor layer SP2 of the second channel structure CH2 may be a lowermost semiconductor layer of the second channel structure CH2. the third channel structure CH3 may include one semiconductor layer SP1, e.g., the first semiconductor layer SP1. The first semiconductor layer SP1 of the third channel structure CH3 may be referred to as a lowermost semiconductor layer or an uppermost semiconductor layer of the third channel structure CH3.

The first source/drain patterns SD1 may be disposed between the first channel structure CH1 and the second channel structure CH2 and between the second channel structure CH2 and the third channel structure CH3, respectively. For example, the first channel structure CH1 and the second channel structure CH2 may be connected to each other through one of the first source/drain patterns SD1, and the second channel structure CH2 and the third channel structure CH3 may be connected to each other through another of the first source/drain patterns SD1.

Referring to FIGS. 1, 2B, 2C, 2D and 2E, a plurality of second source/drain patterns SD2 may be provided on the second active pattern AP2 of the NMOSFET region NR. The second source/drain patterns SD2 may be spaced apart from each other in the first direction D1 and may be arranged in the first direction D1. The second source/drain patterns SD2 may be provided in second recesses RS2 formed on the second active pattern AP2. The second source/drain patterns SD2 may be or may include epitaxial patterns formed by a SEG process the same as, or different from, the SEG process of forming the first source/drain patterns SD1. The second source/drain patterns SD2 may include dopants having a second conductivity type (e.g., an N-type such as at least one of phosphorus or arsenic) different from the first conductivity type, that may be incorporated during the SEG process and/or may be implanted into the second source/drain patterns SD2. The second source/drain patterns SD2 may include the same semiconductor element (e.g., silicon (Si)) as the substrate 100, and may or may not include germanium.

The channel structures CH1, CH2 and CH3 of the NMOSFET region NR may be provided between the plurality of second source/drain patterns SD2. At least one of the channel structures CH1, CH2 and CH3 of the NMOSFET region NR may include a plurality of semiconductor layers SP1, SP2 and SP3 stacked in the third direction D3. The semiconductor layers SP1, SP2 and SP3 of the NMOSFET region NR may be the same as or similar to the semiconductor layers SP1, SP2 and SP3 of the PMOSFET region PR described above. For example, the semiconductor layers SP1, SP2, and SP3 of the NMOSFET region NR may include the same material as the semiconductor layers SP1, SP2 and SP3 of the PMOSFET region PR. Alternatively or additionally, first to third semiconductor layers SP1, SP2 and SP3 of the NMOSFET region NR may be located at the same levels as the first to third semiconductor layers SP1, SP2 and SP3 of the PMOSFET region PR, respectively.

Each of the channel structures CH1, CH2 and CH3 of the NMOSFET region NR may connect a pair of the second source/drain patterns SD2 adjacent to each other in the first direction D1. The first channel structure CH1 of the NMOSFET region NR may include three semiconductor layers SP1, SP2 and SP3 and may not include any other semiconductor layers. The first channel structure CH1 may include the first semiconductor layer SP1, the second semiconductor layer SP2, and the third semiconductor layer SP3, and may not include any other semiconductor layers. For example, the second channel structure CH2 of the NMOSFET region NR may include two semiconductor layers SP1 and SP2. The second channel structure CH2 may include the first semiconductor layer SP1 and the second semiconductor layer SP2, and may not include any other semiconductor layers. For example, the third channel structure CH3 of the NMOSFET region NR may include one (e.g. only one) semiconductor layer, e.g., the first semiconductor layer SP1.

Referring to FIGS. 1 and 2A to 2E, the gate electrodes GE1, GE2 and GE3 may extend in the second direction D2 to intersect the first active pattern AP1 and the second active pattern AP2. The gate electrodes GE1, GE2 and GE3 may vertically overlap with the first to third channel structures CH1, CH2 and CH3, respectively. In more detail, a first gate electrode GE1 may intersect the first channel structure CH1 of the PMOSFET region PR and the first channel structure CH1 of the NMOSFET region NR. A second gate electrode GE2 may intersect the second channel structure CH2 of the PMOSFET region PR and the second channel structure CH2 of the NMOSFET region NR. A third gate electrode GE3 may intersect the third channel structure CH3 of the PMOSFET region PR and the third channel structure CH3 of the NMOSFET region NR. The first to third gate electrodes GE1, GE2, and GE3 may surround at least portions of the first to third channel structures CH1, CH2, and CH3, respectively. At least one of the first to third gate electrodes GE1, GE2, and GE3 may each continuously over the NMOSFET region NR and the PMOSFET region PR. A total thickness of a portion of the first to third gate electrodes GE1, GE2, and GE3 that is on top of or over the isolation layer ST may be greater than a thickness of the first to third gate electrodes GE1, GE2, and GE3 that is over the active patterns AP1 and AP2; however, example embodiments are not limited thereto. The isolation layer ST may have a dishing profile; however, example embodiments are not limited thereto.

Figure 3A:
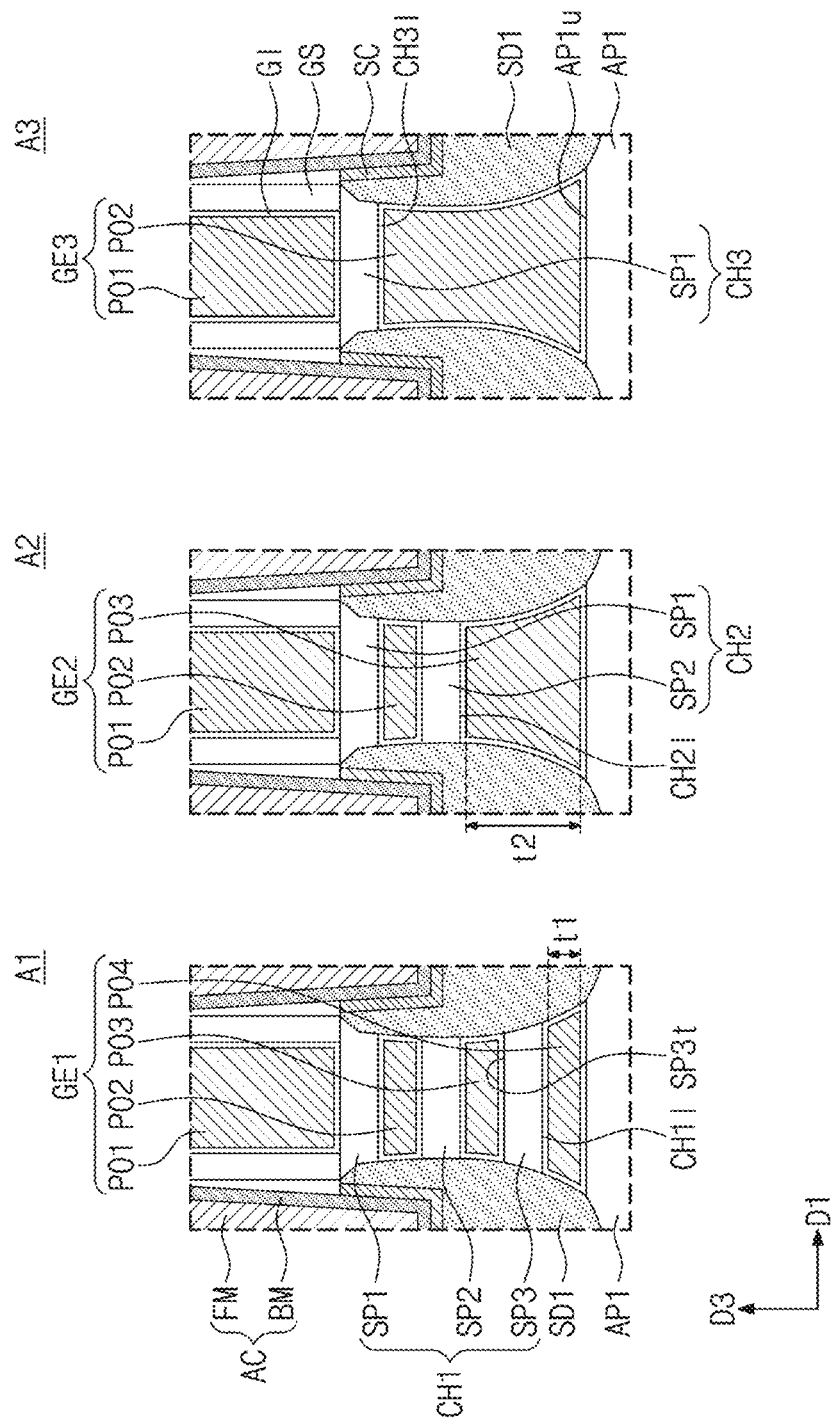
FIG. 3A is an enlarged cross-sectional view of regions 'A1', 'A2' and 'A3' of FIG. 2A.
Figure 3B:
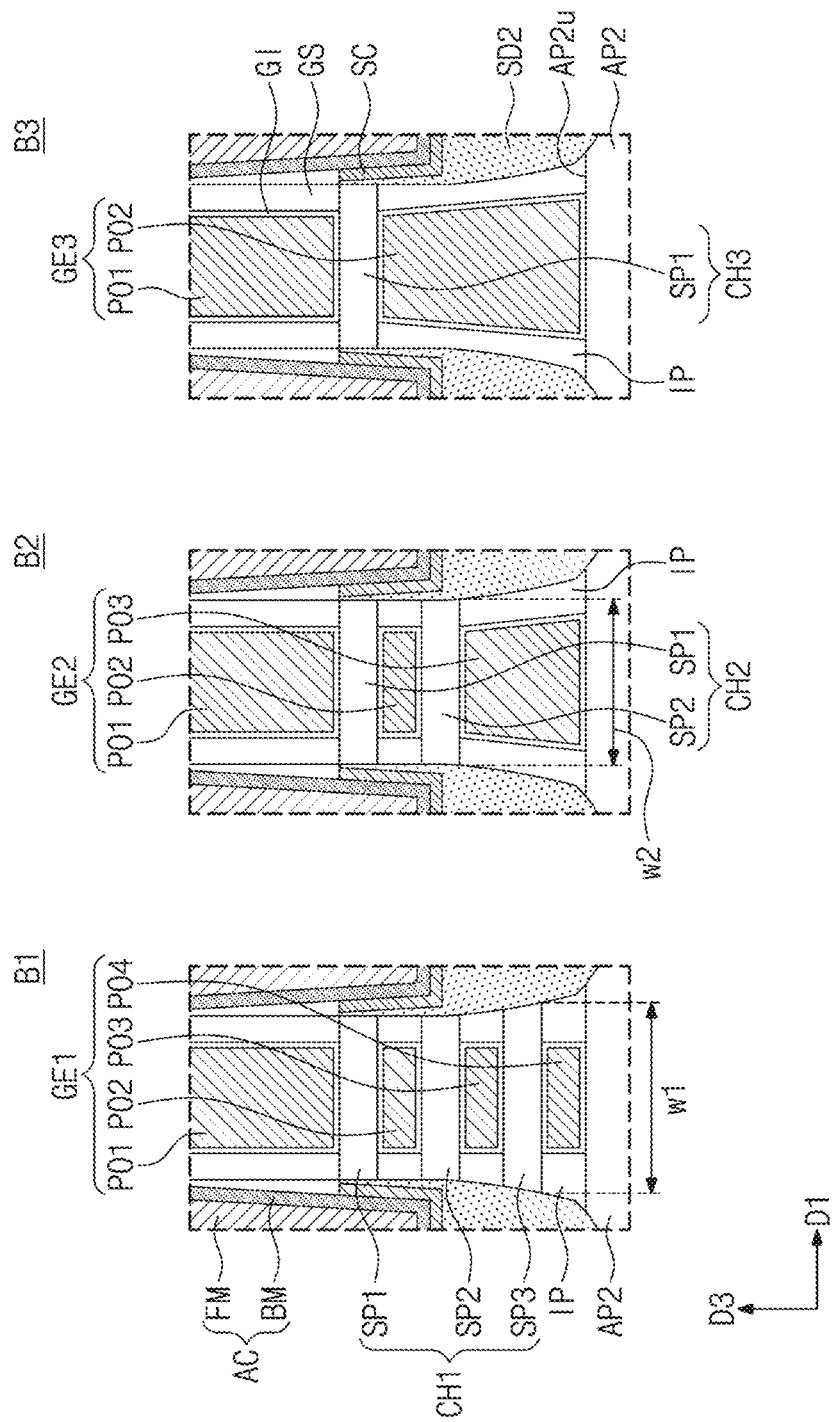
FIG. 3B is an enlarged cross-sectional view of regions 'B1', 'B2' and 'B3' of FIG. 2B.

Referring to FIGS. 3A and 3B, the first gate electrode GE1 may include a first portion PO1 on a top surface of the first semiconductor layer SP1, a second portion PO2 disposed between the first semiconductor layer SP1 and the second semiconductor layer SP2, a third portion PO3 disposed between the second semiconductor layer SP2 and the third semiconductor layer SP3, and a fourth portion PO4 disposed between the active pattern AP1 or AP2 and the third semiconductor layer SP3.

The second gate electrode GE2 may include a first portion PO1 on a top surface of the first semiconductor layer SP1, a second portion PO2 disposed between the first semiconductor layer SP1 and the second semiconductor layer SP2, and a third portion PO3 disposed between the active pattern AP1 or AP2 and the second semiconductor layer SP2.

The third gate electrode GE3 may include a first portion PO1 on a top surface of the first semiconductor layer SP1, and a second portion PO2 disposed between the active pattern AP1 or AP2 and the first semiconductor layer SP1.

Referring again to FIGS. 1 and 2A to 2E, a pair of gate spacers GS may be disposed on both sidewalls of the first portion PO1 of each of the gate electrodes GE1, GE2 and GE3, respectively. The gate spacers GS may extend along the gate electrodes GE1, GE2 and GE3 in the second direction D2. Top surfaces of the gate spacers GS may be higher than top surfaces of the gate electrodes GE1, GE2 and GE3. The top surfaces of the gate spacers GS may be coplanar with a top surface of a first interlayer insulating layer 110 to be described later. The gate spacers GS may include at least one of SiCN, SiCON, or SiN. In some example embodiments, each of the gate spacers GS may have a multi-layered structure formed of at least two of SiCN, SiCON, or SiN.

Gate capping patterns GP may be provided on the gate electrodes GE1, GE2 and GE3, respectively. The gate capping patterns GP may extend along the gate electrodes GE1, GE2 and GE3 in the second direction D2. The gate capping patterns GP may include a material having an etch selectivity with respect to (e.g. may etch slower than) first and second interlayer insulating layers 110 and 120 to be described later. For example, the gate capping patterns GP may include at least one of SiON, SiCN, SiCON, or SiN.

A gate insulating layer GI may be disposed between the gate electrodes GE1, GE2 and GE3 and the channel structures CH1, CH2 and CH3. The gate insulating layer GI may cover a top surface TS, a bottom surface BS and both sidewalls SW of each of the first to third semiconductor layers SP1, SP2 and SP3. The gate insulating layer GI may cover a top surface of the device isolation layer ST and top surfaces of the active patterns AP1 and AP2 under the gate electrodes GE1, GE2 and GE3.

In some example embodiments, the gate insulating layer GI may include at least one of a silicon oxide layer, a silicon oxynitride layer, and/or a high-k dielectric layer. The high-k dielectric layer may include a high-k dielectric material of which a dielectric constant is higher than that of a silicon oxide layer. For example, the high-k dielectric material may include at least one of hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

In some example embodiments, the semiconductor device according to inventive concepts may include a negative capacitance (NC) field effect transistor (FET) using a negative capacitor. For example, the gate insulating layer GI may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series to each other and a capacitance of each of the capacitors has a positive value, a total capacitance may be reduced to be less than the capacitance of each of the capacitors. Alternatively, when at least one of two or more capacitors connected in series to each other has a negative value, a total capacitance may have a positive value and may be greater than an absolute value of a capacitance of each of the capacitors.

When the ferroelectric material layer having the negative capacitance is connected in series to the paraelectric material layer having the positive capacitance, a total capacitance value of the ferroelectric and paraelectric material layers connected in series may increase. The transistor including the ferroelectric material layer may have a subthreshold swing (SS) less than 60 mV/decade at room temperature by using the increase in the total capacitance value.

The ferroelectric material layer may have the ferroelectric properties. For example, the ferroelectric material layer may include at least one of hafnium oxide, hafnium zirconium oxide, barium strontium titanium oxide, barium titanium oxide, or lead zirconium titanium oxide. Here, for an example, the hafnium zirconium oxide may be a material formed by doping hafnium oxide with zirconium (Zr). Alternatively or additionally, the hafnium zirconium oxide may be a compound of hafnium (Hf), zirconium (Zr), and oxygen (O).

The ferroelectric material layer may further include dopants doped/implanted/incorporated therein. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A kind of the dopants included in the ferroelectric material layer may be changed depending on a kind of the ferroelectric material included in the ferroelectric material layer.

When the ferroelectric material layer includes hafnium oxide, the dopants included in the ferroelectric material layer may include at least one of, for example, gadolinium (Gd), silicon (Si), zirconium (Zr), aluminum (Al), or yttrium (Y).

When the dopants are aluminum (Al), the ferroelectric material layer may include aluminum of 3 at % (atomic %) to 8 at %. Here, a ratio of the dopants may be a ratio of the amount of aluminum to a sum of the amounts of hafnium and aluminum.

When the dopants are silicon (Si), the ferroelectric material layer may include silicon of 2 at % to 10 at %. When the dopants are yttrium (Y), the ferroelectric material layer may include yttrium of 2 at % to 10 at %. When the dopants are gadolinium (Gd), the ferroelectric material layer may include gadolinium of 1 at % to 7 at %. When the dopants are zirconium (Zr), the ferroelectric material layer may include zirconium of 50 at % to 80 at %.

The paraelectric material layer may have the paraelectric properties. For example, the paraelectric material layer may include at least one of silicon oxide or a metal oxide having a high-k dielectric constant. For example, the metal oxide included in the paraelectric material layer may include at least one of hafnium oxide, zirconium oxide, or aluminum oxide.

The ferroelectric material layer and the paraelectric material layer may include the same material. The ferroelectric material layer may have the ferroelectric properties, but the paraelectric material layer may not have the ferroelectric properties. For example, when the ferroelectric material layer and the paraelectric material layer include hafnium oxide, a crystal structure of hafnium oxide included in the ferroelectric material layer may be different from a crystal structure of hafnium oxide included in the paraelectric material layer.

The ferroelectric material layer may have a thickness showing the ferroelectric properties. For example, the thickness of the ferroelectric material layer may range from 0.5 nm to 10 nm. However, some example embodiments of inventive concepts are not limited thereto. A critical thickness showing the ferroelectric properties may be changed depending on a kind of a ferroelectric material, and thus the thickness of the ferroelectric material layer may be changed depending on a kind of the ferroelectric material included therein. For some examples, the gate insulating layer GI may include a single ferroelectric material layer. For other examples, the gate insulating layer GI may include a plurality of ferroelectric material layers spaced apart from each other. The gate insulating layer GI may have a stack structure in which the ferroelectric material layers and the paraelectric material layers are alternately stacked.

Each of the gate electrodes GE1, GE2 and GE3 may include a first metal pattern and a second metal pattern on the first metal pattern. The first metal pattern may be provided on the gate insulating layer GI and may be adjacent to the first to third semiconductor layers SP1, SP2 and SP3. The first metal pattern may include a work function metal for adjusting a threshold voltage of the transistor. A desired threshold voltage of the transistor may be obtained by adjusting a thickness and/or a composition of the first metal pattern. In some example embodiments, the second to fourth portions PO2, PO3 and PO4 of the first gate electrode GE1 may be formed of the first metal pattern including the work function metal. The third portion PO3 of the second gate electrode GE2 may include the first metal pattern and the second metal pattern. The second portion PO2 of the third gate electrode GE3 may include the first metal pattern and the second metal pattern.

The first metal pattern may include a metal nitride layer. For example, the first metal pattern may include nitrogen (N) and at least one metal selected from a group consisting of or including titanium (Ti), tantalum (Ta), aluminum (Al), tungsten (W), and molybdenum (Mo). Alternatively or additionally, the first metal pattern may further include carbon (C). In some example embodiments, the first metal pattern may include a plurality of stacked work function metal layers.

The second metal pattern may include a metal having a resistance lower than that of the first metal pattern. For example, the second metal pattern may include at least one metal selected from a group consisting of or including tungsten (W), aluminum (Al), titanium (Ti), and tantalum (Ta). For example, each of the first portions PO1 of the gate electrodes GE1, GE2 and GE3 may include the first metal pattern and the second metal pattern on the first metal pattern.

Referring again to FIG. 2B, inner spacers IP may be provided on the NMOSFET region NR. The inner spacers IP may be disposed between the second source/drain patterns SD2 and the second to fourth portions PO2, PO3 and PO4 of the gate electrodes GE1, GE2 and GE3, respectively. The inner spacers IP may be in contact with/direct contact with the second source/drain patterns SD2. Each of the second to fourth portions PO2, PO3 and PO4 of the gate electrodes GE1, GE2 and GE3 may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surface of the gate capping pattern GP and the top surface of the gate spacer GS. A second interlayer insulating layer 120 may be disposed on the first interlayer insulating layer 110 and the gate capping patterns GP. Each of the first and second interlayer insulating layers 110 and 120 may include, for example, a silicon oxide layer. Separation structures DB may be provided on the substrate 100. The separation structures DB may extend in the second direction D2 in parallel to the gate electrodes GE1, GE2, and GE3. The separation structures DB may be opposite to each other in the first direction D1. The separation structures DB may penetrate the first and second interlayer insulating layers 110 and 120 and may extend into the first and second active patterns AP1 and AP2. The separation structures DB may penetrate channel structures provided thereunder. The separation structures DB may separate, e.g. may electrically isolate, the PMOSFET and NMOSFET regions PR and NR from other active regions adjacent thereto.

Active contacts AC may penetrate the second and first interlayer insulating layers 120 and 110 so as to be electrically connected to the first and second source/drain patterns SD1 and SD2, respectively. A pair of the active contacts AC may be provided at both sides of each of the gate electrodes GE1, GE2, and GE3, respectively. The active contact AC may have a bar shape extending in the second direction D2 when viewed in a plan view; however, example embodiments are not limited thereto, and the active contact AC may have an elliptical shape, for example.

The active contact AC may be a self-aligned contact. For example, the active contact AC may be formed to be self-aligned using the gate capping pattern GP and the gate spacer GS. For example, the active contact AC may cover at least a portion of a sidewall of the gate spacer GS.

Silicide patterns SC (e.g. salicide patterns) may be disposed between the active contact AC and the first source/drain pattern SD1 and between the active contact AC and the second source/drain pattern SD2, respectively. The active contact AC may be electrically connected to the source/drain pattern SD1 or SD2 through the silicide pattern SC. The silicide pattern SC may include a metal silicide and may include at least one of, for example, titanium silicide, tantalum silicide, tungsten silicide, nickel silicide, or cobalt silicide.

Figure 2A:
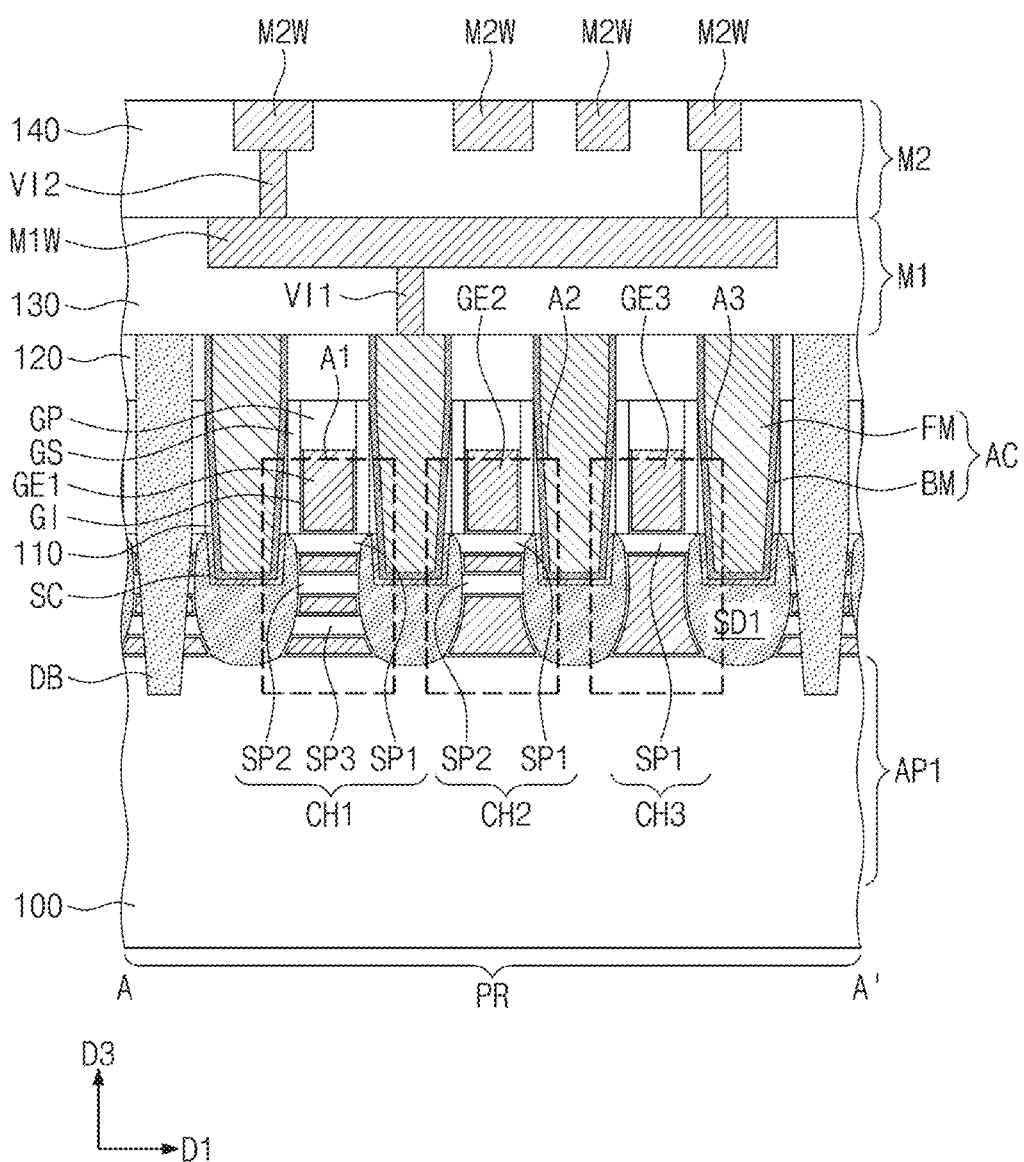
FIGS. 2A to 2E are cross-sectional views taken along lines A-A', B-B', C-C', D-D' and E-E' of FIG. 1, respectively.
Figure 2B:
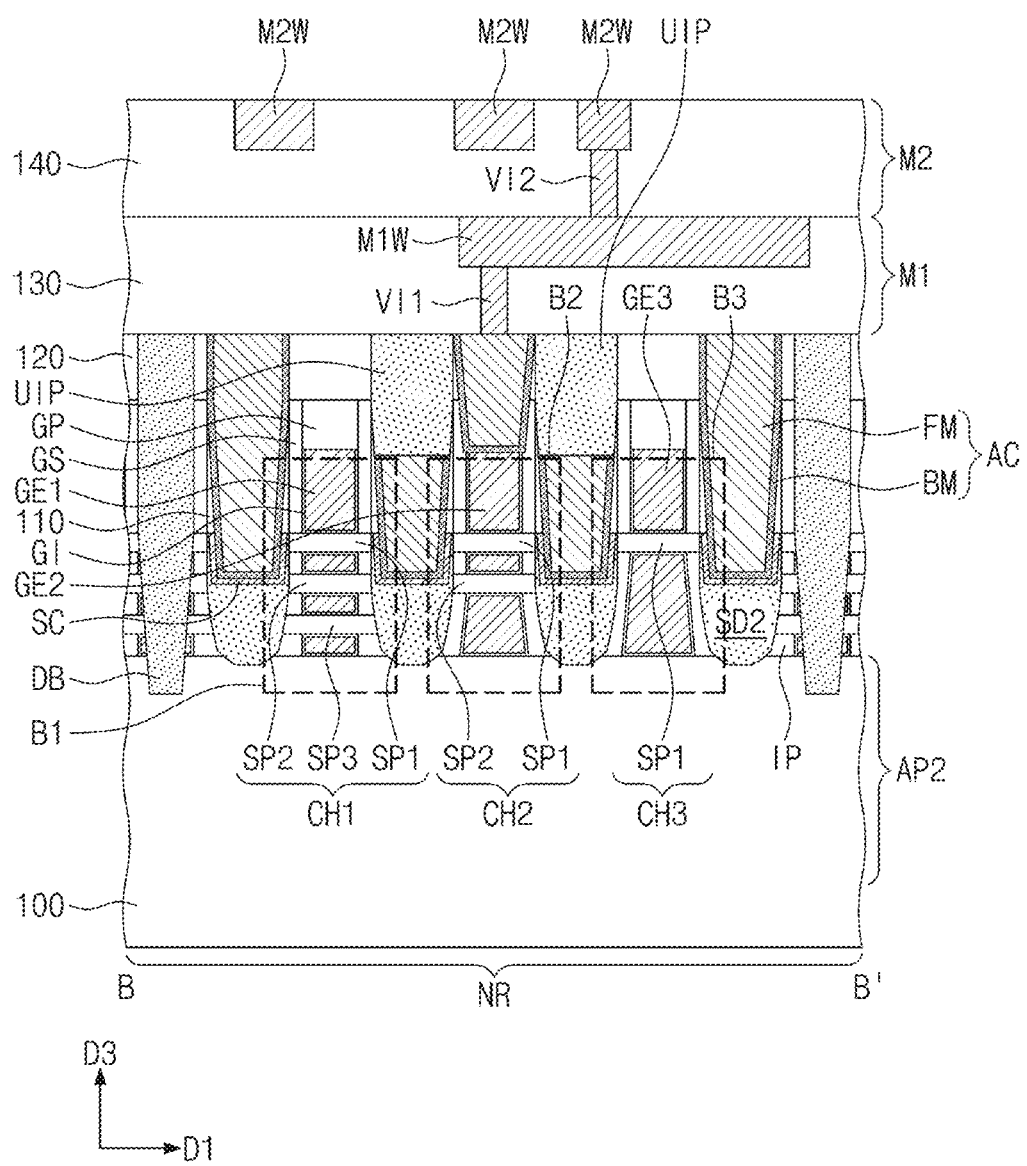
Figure 2C:
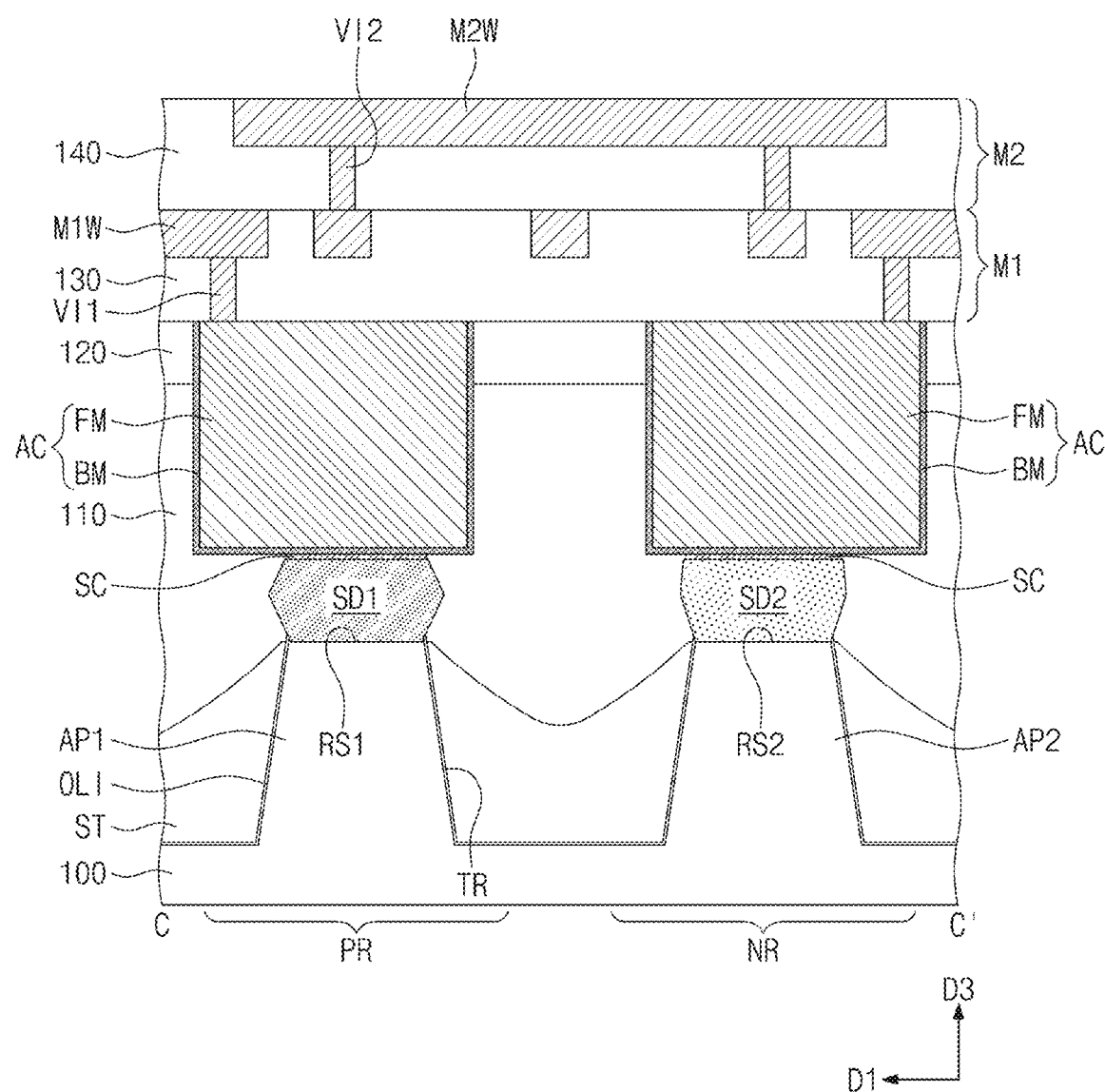
Figure 2D:
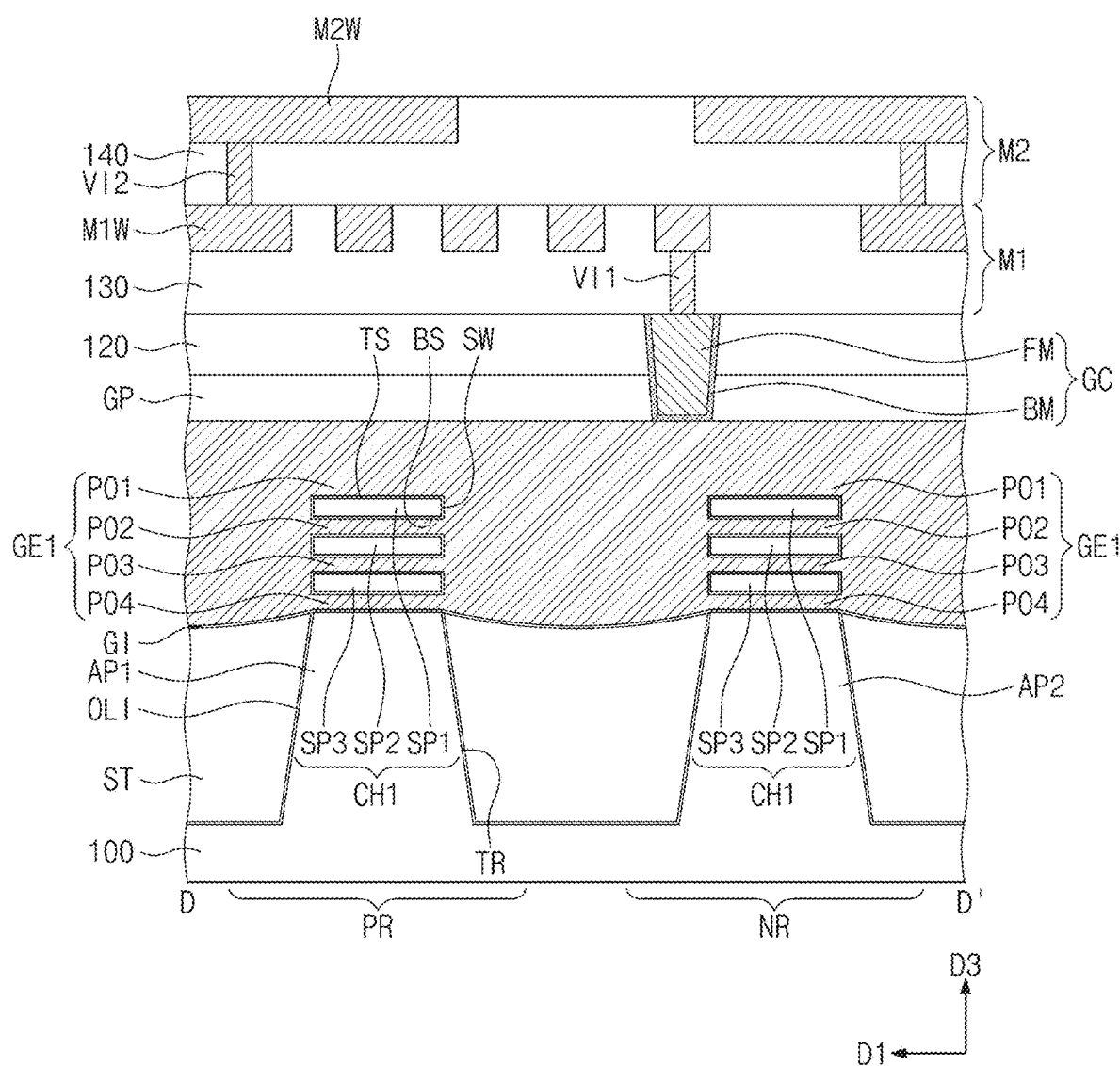
Figure 2E:
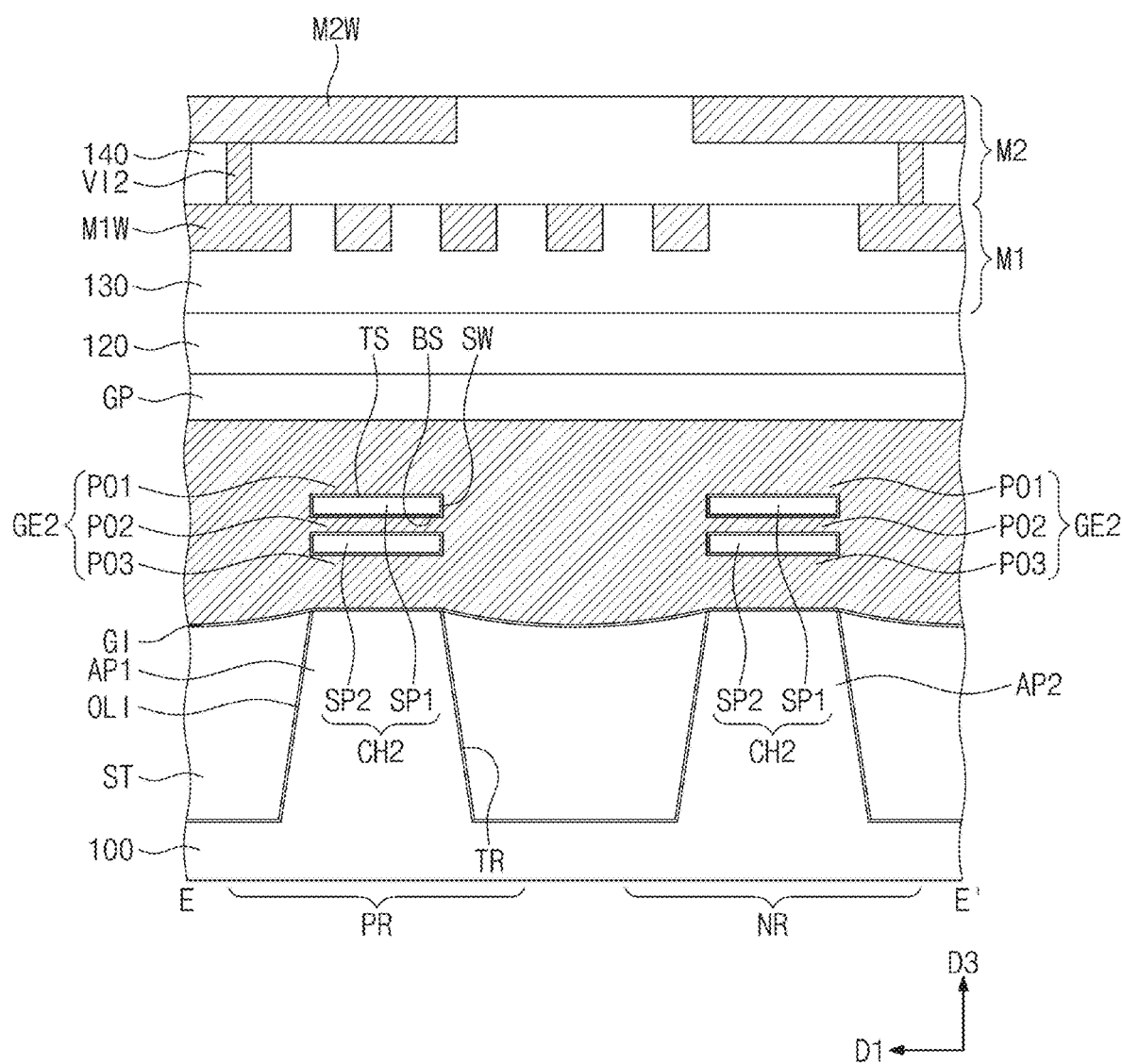

A gate contact GC may penetrate the second interlayer insulating layer 120 and the gate capping pattern GP so as to be electrically connected to each of the gate electrodes GE1, GE2 and GE3. For example, as illustrated in FIG. 2B, an upper portion of each of the active contacts AC adjacent to the gate contact GC may be filled with an upper insulating pattern UIP. Thus, it is possible to prevent or reduce the likelihood of and/or impact from a process defect in which the gate contact GC is in contact with the active contact AC adjacent thereto, which may cause a hard or soft short.

Each of the active contact AC and the gate contact GC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover a bottom surface and sidewalls of the conductive pattern FM. The barrier pattern BM may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A first metal layer M1 may be provided in a third interlayer insulating layer 130 covering the second interlayer insulating layer 120. The first metal layer M1 may include first interconnection lines M1W and first vias VIE The first vias VI1 may be provided under the first interconnection lines M1W. The first interconnection lines M1W may extend in the first direction D1. The first interconnection lines M1W may include a power interconnection line, e.g. a line configured to receive a power rail such as a high voltage (VDD) and/or a ground voltage (GND).

Some of the first vias VI1 may be disposed between the active contacts AC and the first interconnection lines M1W. Others of the first vias VI1 may be disposed between the gate contacts GC and the first interconnection lines M1W. The first interconnection line M1W and the first via VI1 of the first metal layer M1 may be formed by the same or different processes. For example, each of the first interconnection line M1W and the first via VI1 may be formed by separate single damascene processes.

A second metal layer M2 may be provided in a fourth interlayer insulating layer 140 covering the third interlayer insulating layer 130. The second metal layer M2 may include second interconnection lines M2W. Each of the second interconnection lines M2W may have a line or bar shape extending in the second direction D2. For example, the second interconnection lines M2W may extend in the second direction D2 in parallel to each other. The second interconnection lines M2W may be parallel to the gate electrodes GE1, GE2 and GE3 when viewed in a plan view. The second metal layer M2 may further include second vias VI2. The second vias VI2 may be provided under the second interconnection lines M2W. Each of the second vias VI2 may be disposed between a corresponding one of the first interconnection lines M1W and a corresponding one of the second interconnection lines M2W. The second interconnection line M2W and the second via VI2 thereunder in the second metal layer M2 may be formed in one body by the same process. For example, the second interconnection line M2W and the second via VI2 of the second metal layer M2 may be formed together/simultaneously by a dual damascene process. The first interconnection lines M1W of the first metal layer M1 and the second interconnection lines M2W of the second metal layer M2 may include the same conductive material and/or different conductive materials. The first interconnection lines M1W and the second interconnection lines M2W may include at least one metal of aluminum, copper, tungsten, ruthenium, molybdenum, or cobalt.

The channel structures CH1, CH2, and CH3 and the gate electrodes GE1, GE2 and GE3 according to the some example embodiments of inventive concepts will be described hereinafter in more detail with reference to FIG. 3A.

The fourth portion PO4 of the first gate electrode GE1 may be formed between a bottom surface CH11 of the first channel structure CH1 and a top surface AP1$u$ of the first active pattern AP1. The third portion PO3 of the second gate electrode GE2 may be formed between a bottom surface CH21 of the second channel structure CH2 and the top surface AP1$u$ of the first active pattern AP1. A thickness t2 of the third portion PO3 of the second gate electrode GE2 may be greater than a thickness t1 of the fourth portion PO4 of the first gate electrode GE1. For example, the thickness t2 of the third portion PO3 of the second gate electrode GE2 may range from two times to six times the thickness t1 of the fourth portion PO4 of the first gate electrode GE1. Since the third portion PO3 of the second gate electrode GE2 is thicker than the fourth portion PO4 of the first gate electrode GE1, an operating voltage of the semiconductor device may be reduced and/or a power consumption may be reduced.

The second portion PO2 of the second gate electrode GE2 may be provided between the first semiconductor layer SP1 and the second semiconductor layer SP2 of the second channel structure CH2. A thickness of the second portion PO2 of the second gate electrode GE2 may be less than the thickness t2 of the third portion PO3 of the second gate electrode GE2. Thus, the first semiconductor layer SP1 and the second semiconductor layer SP2 may be closer to the active contacts AC than to the top surface AP1$u$ of the first active pattern APE A current path, or a movement path of electrons may be shortened by the first and second semiconductor layers SP1 and SP2 closer to the active contacts AC, and thus the operating voltage of the semiconductor device may be reduced and/or power consumption may be reduced.

In some example embodiments, a top surface of the third portion PO3 of the second gate electrode GE2 may be located at a higher level than a top surface SP3$t$ of the third semiconductor layer SP3. A top surface of the second portion PO2 of the second gate electrode GE2 may be located at a higher level than a bottom surface of the active contact AC. A bottom surface of the third portion PO3 of the second gate electrode GE2 may be located at the same level as a bottom surface of the fourth portion PO4 of the first gate electrode GE1.

The channel structures CH1, CH2 and CH3 and the gate electrodes GE1, GE2 and GE3 according to the various example embodiments of inventive concepts will be described hereinafter in more detail with reference to FIG. 3B. In some example embodiments, lengths of the semiconductor layers SP1, SP2 and SP3 in the first direction D1 may sequentially increase toward a top surface of the second active pattern AP2. For example, a lowermost one of the semiconductor layers SP1, SP2 and/or SP3 constituting each of the channel structures CH1, CH2 and CH3 may have the longest length in the first direction D1 in each of the channel structures CH1, CH2 and CH3. The third semiconductor layer SP3 of the first channel structure CH1 may correspond to the lowermost one of the semiconductor layers SP1, SP2 and SP3 constituting or corresponding to or included in the first channel structure CH1. The second semiconductor layer SP2 of the second channel structure CH2 may correspond to the lowermost one of the semiconductor layers SP1 and SP2 constituting or corresponding to or included in the second channel structure CH2. Here, a length w2, in the first direction D1, of the second semiconductor layer SP2 of the second channel structure CH2 may be less than a length w1, in the first direction D1, of the third semiconductor layer SP3 of the first channel structure CH1. Thus, the second channel structure CH2 may have an electron movement path shorter than that of the first channel structure CH1.

Figure 4:
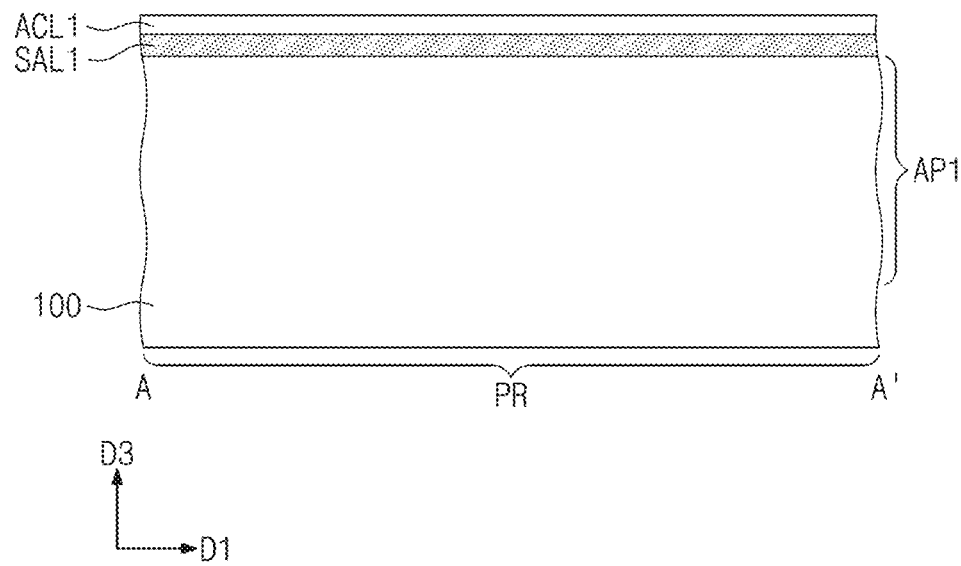
FIGS. 4 to 6 are cross-sectional views corresponding to the line A-A' of FIG. 1 to illustrate a method of manufacturing a semiconductor device according to some example embodiments of inventive concepts.
Figure 5:
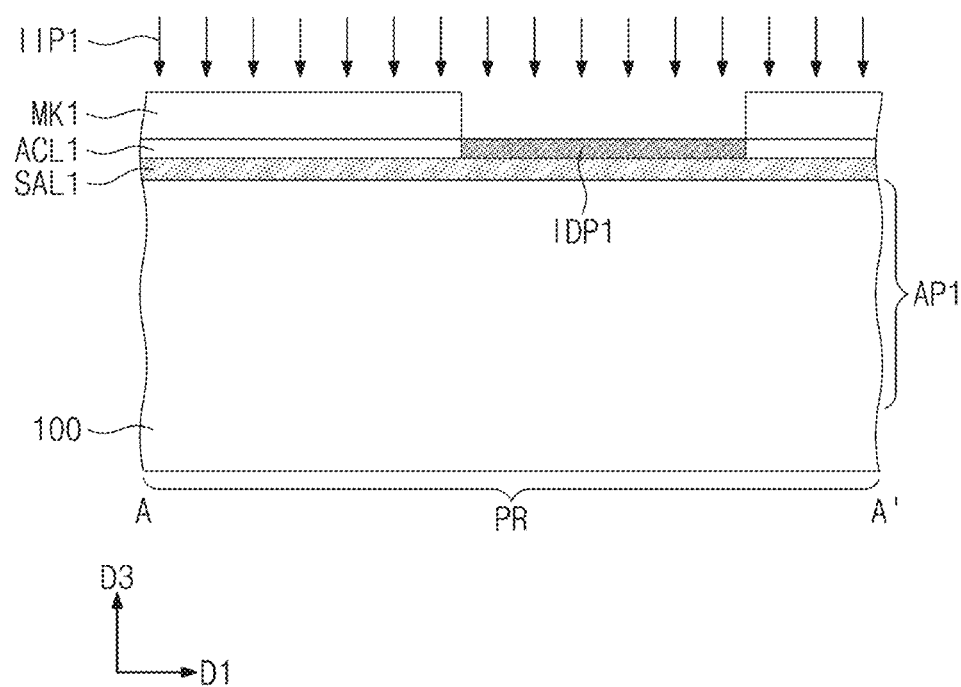
Figure 6:
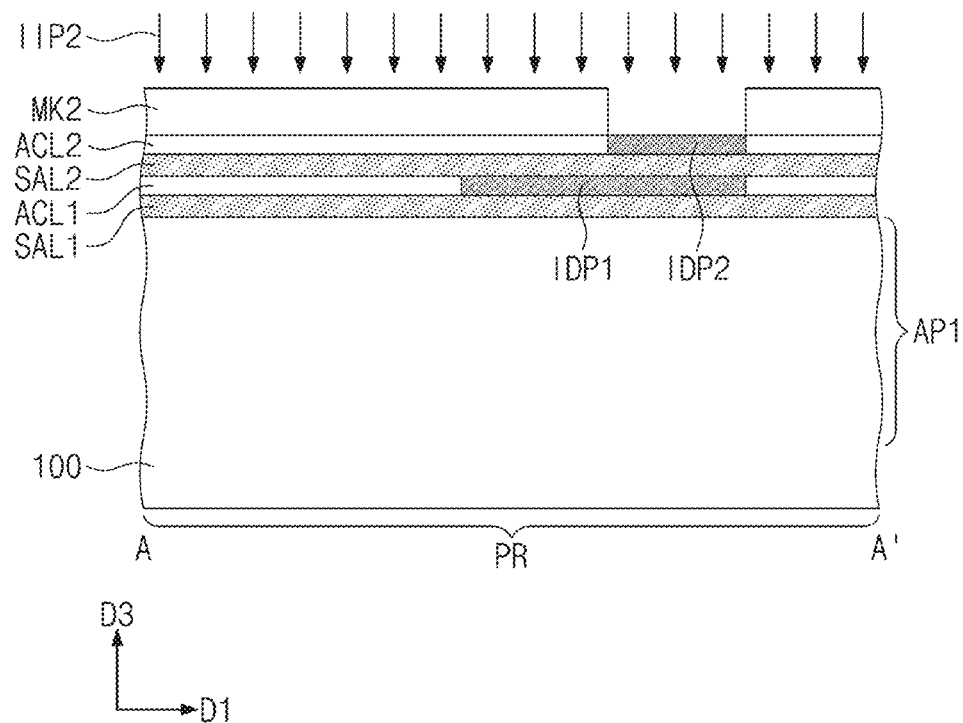

FIGS. 4 to 6 are cross-sectional views corresponding to the line A-A' of FIG. 1 to illustrate a method of manufacturing/fabricating a semiconductor device according to some example embodiments of inventive concepts. FIGS. 7A, 8A, 9A, 10A, 11A and 12A are cross-sectional views corresponding to the line A-A' of FIG. 1 to illustrate a method of manufacturing/fabricating a semiconductor device according to some example embodiments of inventive concepts. FIGS. 9B, 10B, 11B and 12B are cross-sectional views corresponding to the line B-B' of FIG. 1 to illustrate a method of manufacturing/fabricating a semiconductor device according to some example embodiments of inventive concepts. FIGS. 9C, 10C, 11C and 12C are cross-sectional views corresponding to the line C-C' of FIG. 1 to illustrate a method of manufacturing/fabricating a semiconductor device according to some example embodiments of inventive concepts. FIGS. 7B, 8B, 9D, 10D, 11D and 12D are cross-sectional views corresponding to the line E-E' of FIG. 1 to illustrate a method of manufacturing/fabricating a semiconductor device according to some example embodiments of inventive concepts.

Referring to FIGS. 1 and 4, a substrate 100 including a PMOSFET region PR and an NMOSFET region NR may be provided. A first sacrificial layer SAL1 and a first active layer ACL1 may be sequentially formed on the substrate 100, e.g. with a deposition process such as a chemical vapor deposit (CVD) process. The first sacrificial layer SAL1 may include one of silicon (Si), germanium (Ge), and silicon-germanium (SiGe), and the first active layer ACL1 may include another of silicon (Si), germanium (Ge), and silicon-germanium (SiGe). For example, the first sacrificial layer SAL1 may include silicon-germanium (SiGe), and the first active layer ACL1 may include silicon (Si). A concentration of germanium (Ge) in the first sacrificial layer SAL1 may range from 10 at % to 30 at %.

Referring to FIG. 5, a first mask pattern MK1 may be formed on the first active layer ACL1. The first mask pattern MK1 may have an opening exposing a portion of a top surface of the first active layer ACL1. A first ion implantation process IIP1 may be performed on the first mask pattern MK1 to form a first ion implantation pattern IDP1. The first ion implantation process IIP1 may be or may include a beamline ion implantation process; however, example embodiments are not limited thereto. Impurities may be implanted into the first active layer ACL1 through the opening of the first mask pattern MK1 during the first ion implantation process IIP1. The first ion implantation pattern IDP1 may be formed from a portion of the first active layer ACL1. The first ion implantation pattern IDP1 may have an etch selectivity with respect to (e.g. may etch slower than) the first active layer ACL1. The first ion implantation pattern IDP1 may not have an etch selectivity with respect to the first sacrificial layer SAL1. For example, the first ion implantation pattern IDP1 and the first sacrificial layer SAL1 may be etched by and/or at the same rate with the same etchant. In some example embodiments, the first ion implantation process IIP1 may be performed using a germanium (Ge) element, and the first ion implantation pattern IDP1 may include the germanium (Ge) element. The first mask pattern MK1 may be removed, e.g. with an ash process and/or a cleaning process, after the formation of the first ion implantation pattern IDP1.

Referring to FIG. 6, a second sacrificial layer SAL2, a second active layer ACL2 and a second mask pattern MK2 may be sequentially formed on the first active layer ACL1 with a process such as at least one of a CVD process or an atomic layer deposition (ALD) process. Next, a second ion implantation process IIP2 may be performed on the second mask pattern MK2 to form a second ion implantation pattern IDP2. The second ion implantation pattern IDP2 may vertically overlap with the first ion implantation pattern IDP1. The second ion implantation process IIP2 may be performed using the same semiconductor element (e.g. group IV element) as the first ion implantation process IIP1. The second ion implantation pattern IDP2 may include the same material as the first ion implantation pattern IDP1. The second mask pattern MK2 may be removed after the formation of the second ion implantation pattern IDP2.

Figure 7A:
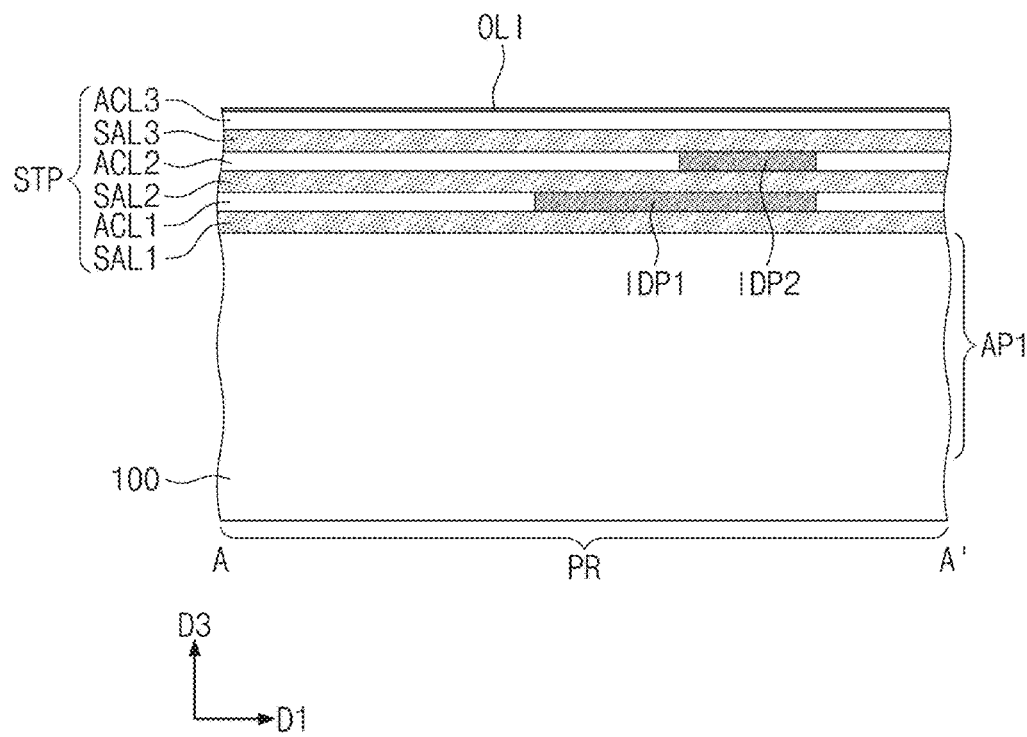
FIGS. 7A, 8A, 9A, 10A, 11A and 12A are cross-sectional views corresponding to the line A-A' of FIG. 1 to illustrate a method of manufacturing a semiconductor device according to some example embodiments of inventive concepts.
Figure 7B:
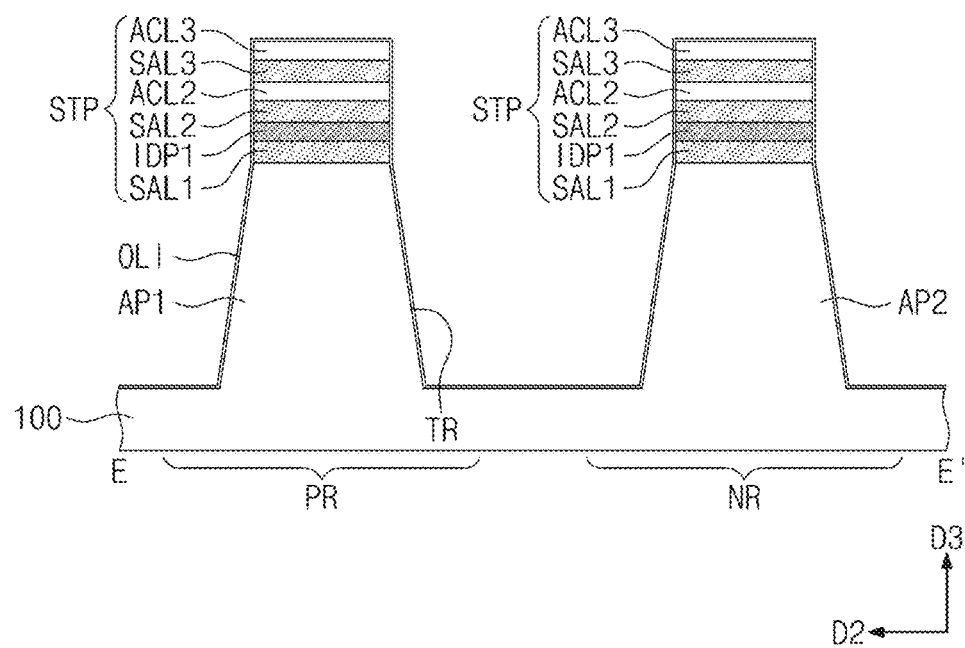
FIGS. 7B, 8B, 9D, 10D, 11D and 12D are cross-sectional views corresponding to the line E-E' of FIG. 1 to illustrate a method of manufacturing a semiconductor device according to some example embodiments of inventive concepts.

Referring to FIGS. 7A and 7B, a third sacrificial layer SAL3 and a third active layer ACL3 may be sequentially formed on the second active layer ACL2 and may include the same or a similar process as used to form the second sacrificial layer SAL2 and the second active layer ACL2; however, example embodiments are not limited thereto.

Next, etch mask patterns may be formed on the PMOSFET region PR and the NMOSFET region NR of the substrate 100, respectively. The etch mask patterns may have line or bar shapes extending in the first direction D1.

A patterning process may be performed using the etch mask patterns to form a trench TR defining a first active pattern AP1 and a second active pattern AP2. The first active pattern AP1 and the second active pattern AP2 may be formed on the PMOSFET region PR and the NMOSFET region NR, respectively. A stack pattern STP may be formed on each of the first and second active patterns AP1 and AP2. The stack pattern STP may include the sacrificial layers SAL1, SAL2, and SAL3 and the active layers ACL1, ACL2 and ACL3 which are alternately stacked. The stack pattern STP may include the first ion implantation pattern IDP1 and the second ion implantation pattern IDP2, each of which is formed at the same level as one of the active layers ACL1, ACL2 and ACL3. The stack patterns STP may be formed together with the first and second active patterns AP1 and AP2 in the patterning process.

A liner layer OLI may be formed on the first and second active patterns AP1 and AP2. The liner layer OLI may be conformally formed by an atomic layer deposition (ALD) process, and may be formed with a conformal deposition process. The liner layer OLI may cover the first and second active patterns AP1 and AP2 and the stack patterns STP. The liner layer OLI may include a silicon oxide layer.

Figure 8A:
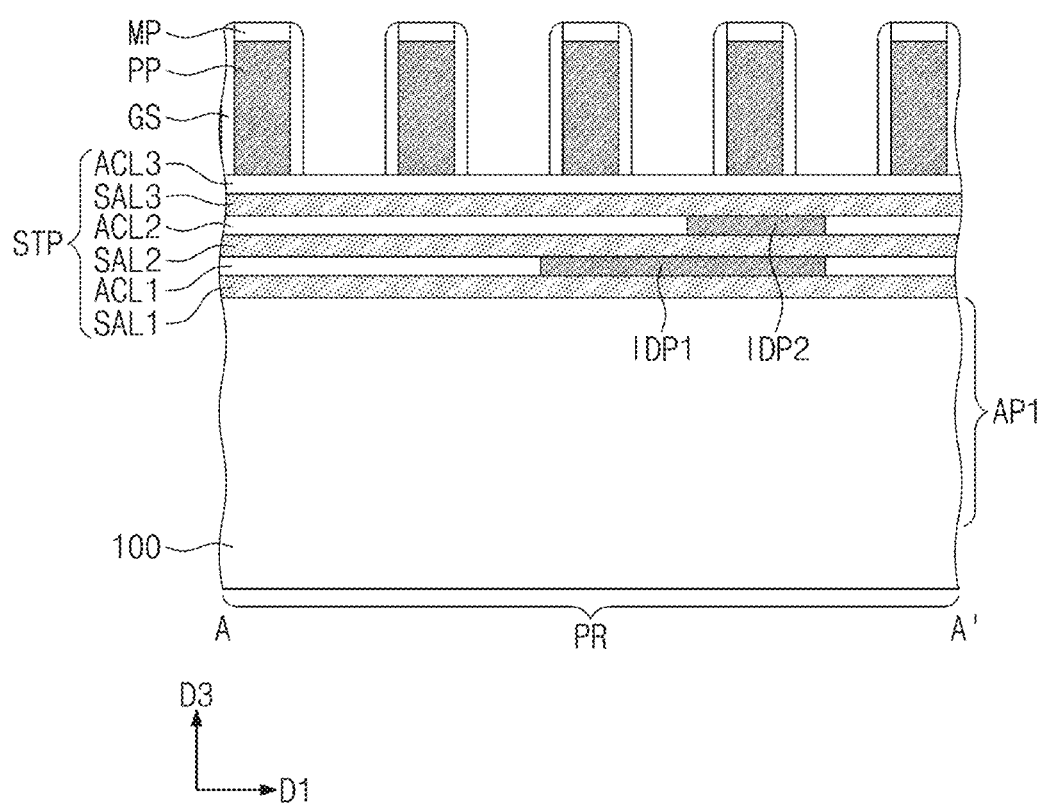
Figure 8B:
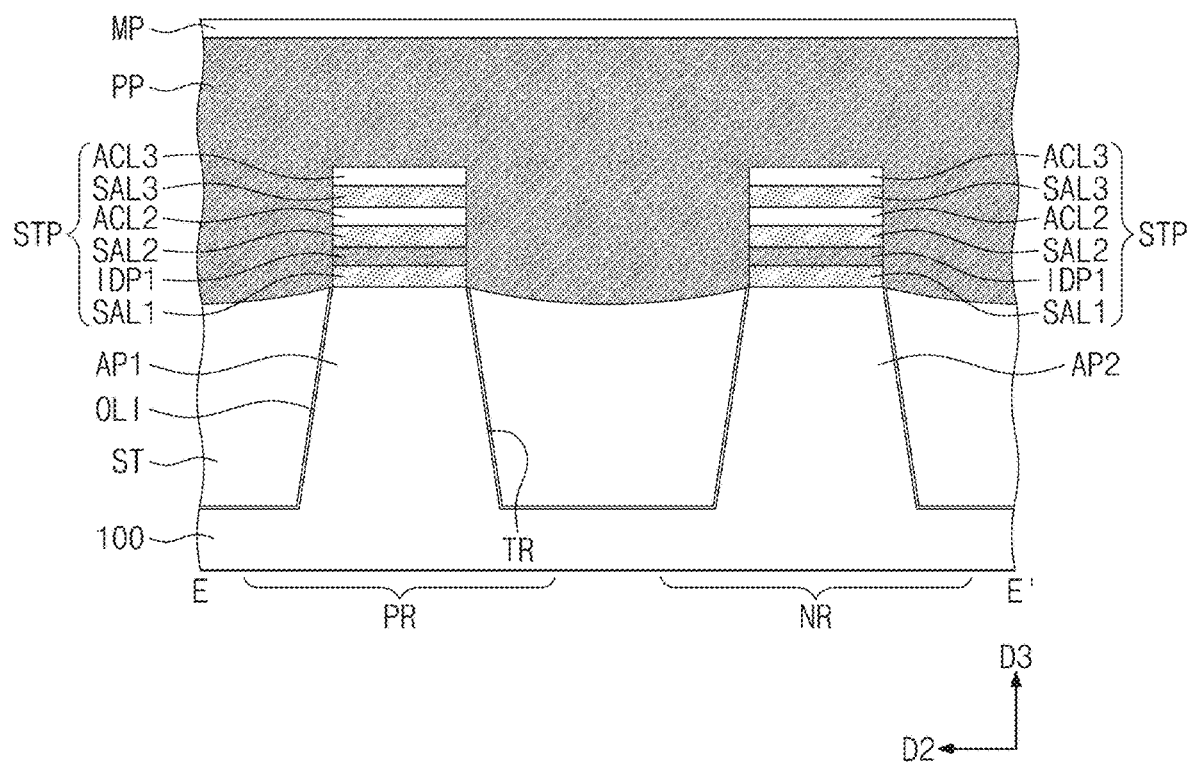
Figure 9A:
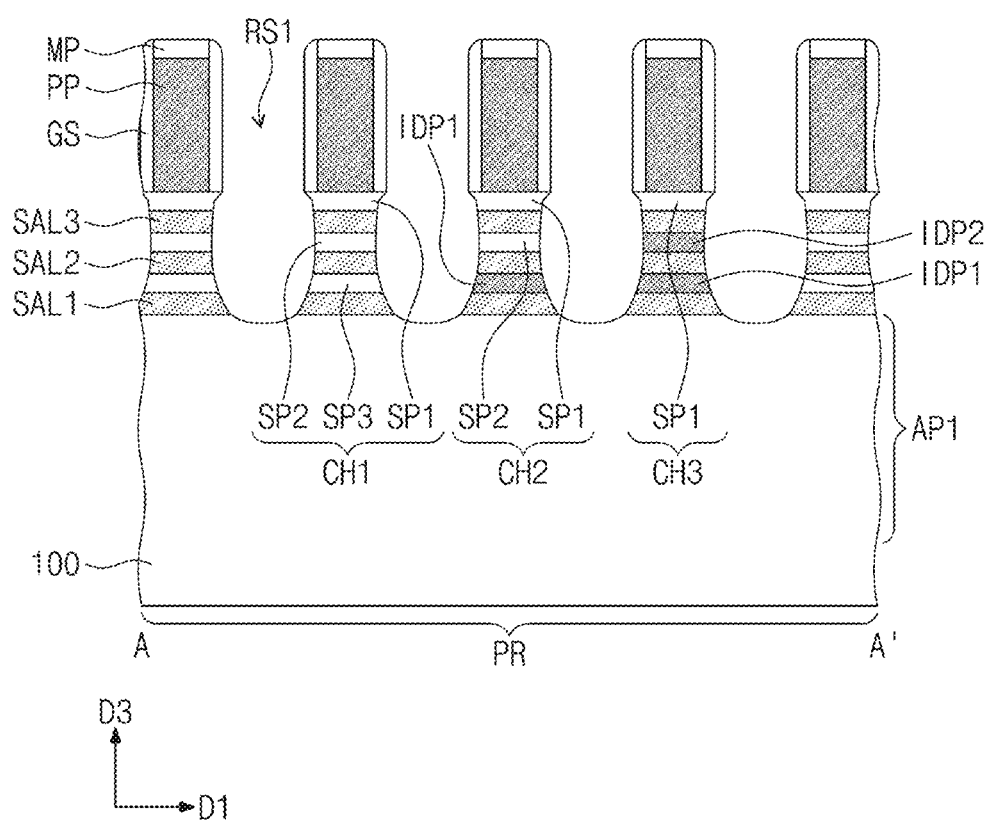
Figure 9B:
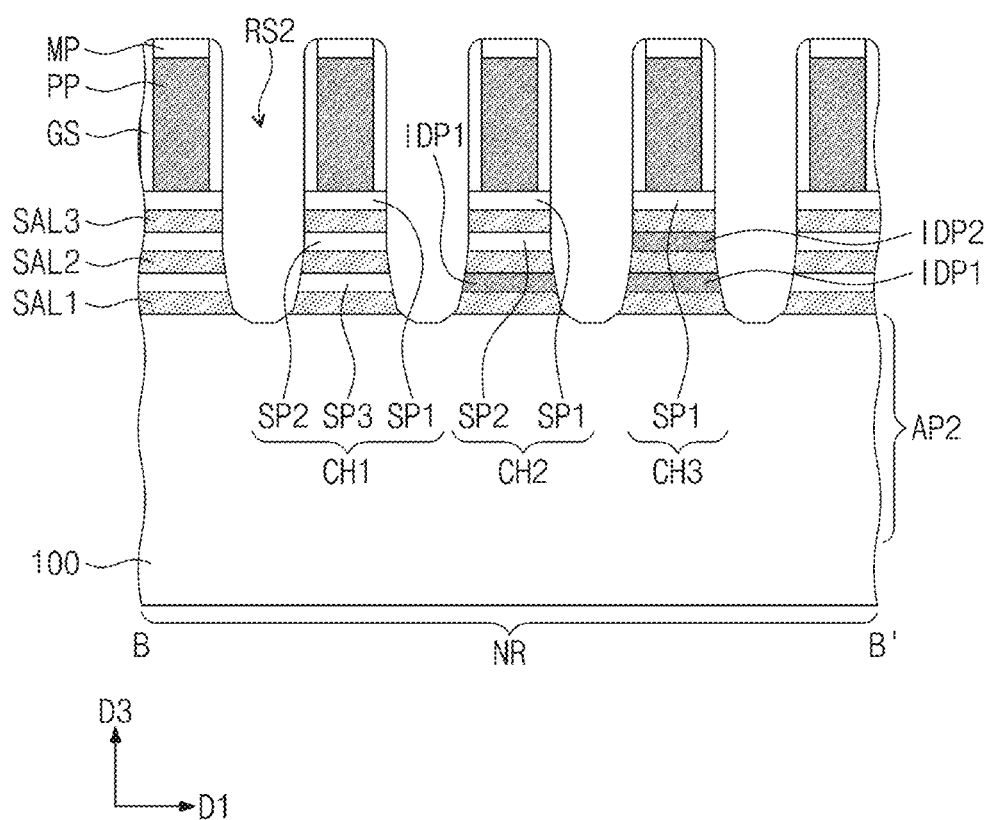
FIGS. 9B, 10B, 11B and 12B are cross-sectional views corresponding to the line B-B' of FIG. 1 to illustrate a method of manufacturing a semiconductor device according to some example embodiments of inventive concepts.
Figure 9C:
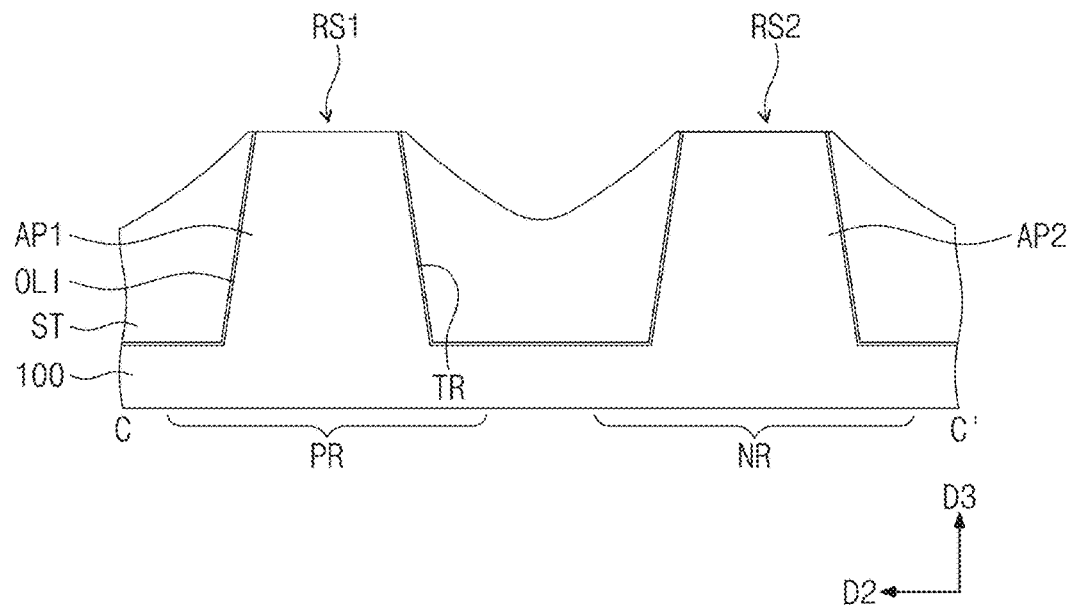
FIGS. 9C, 10C, 11C and 12C are cross-sectional views corresponding to the line C-C' of FIG. 1 to illustrate a method of manufacturing a semiconductor device according to some example embodiments of inventive concepts.
Figure 9D:
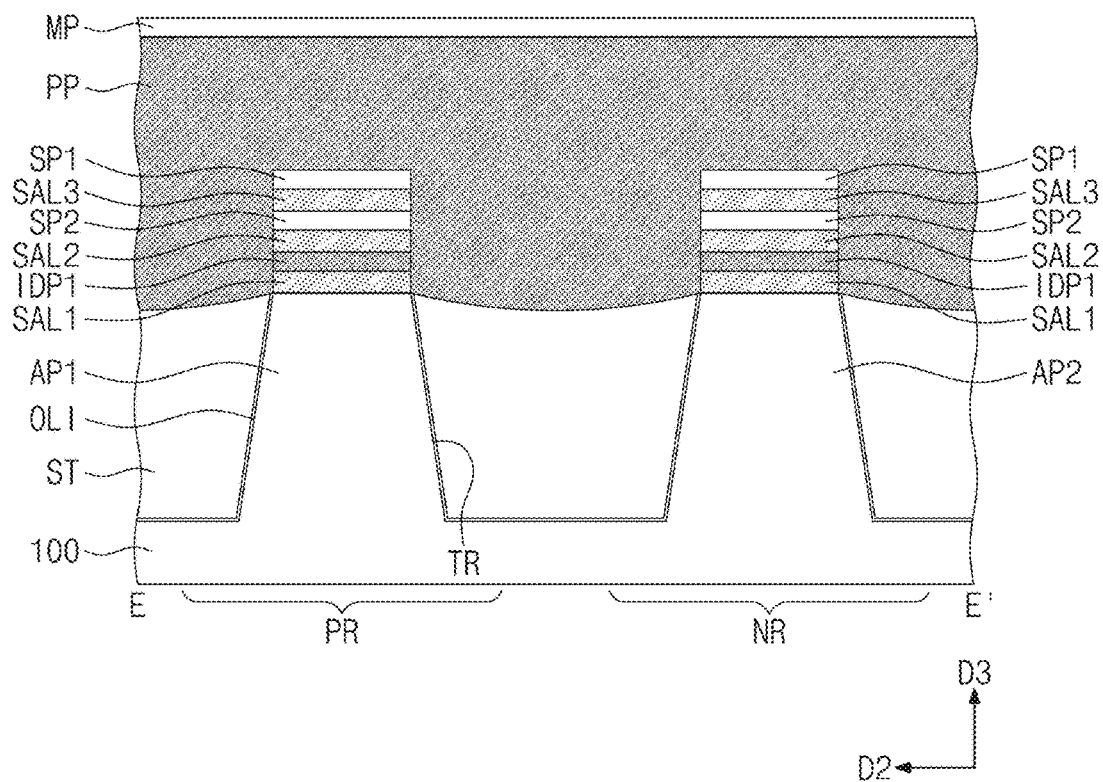
Figure 10A:
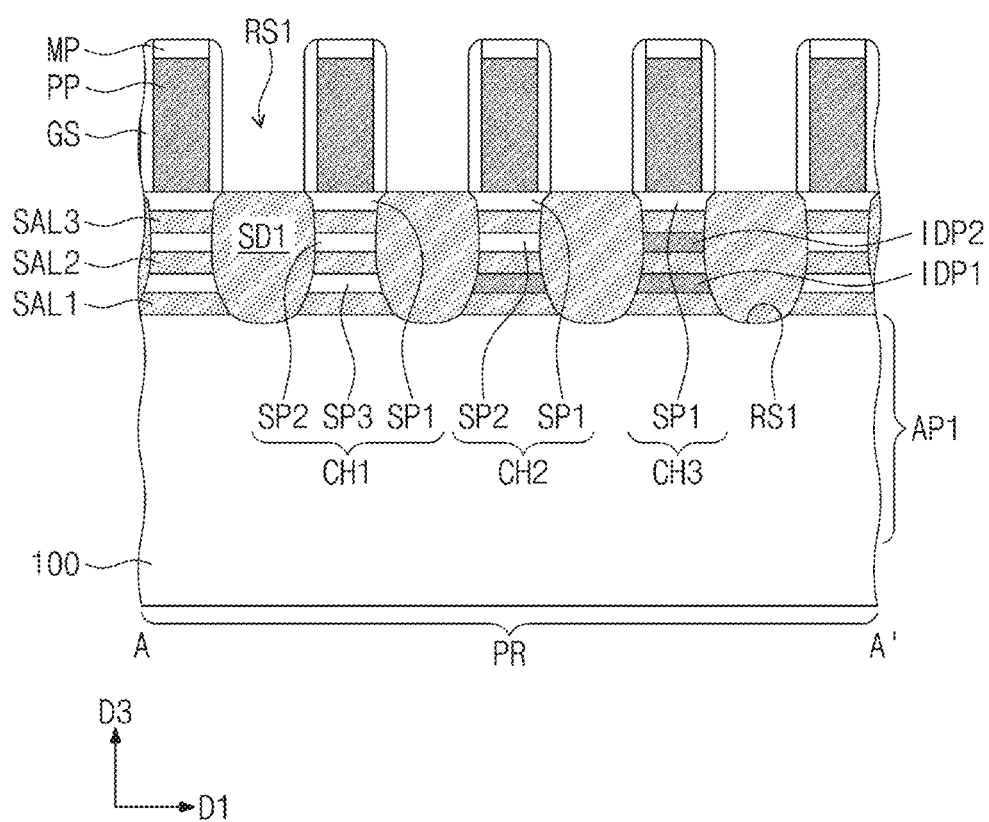
Figure 10B:
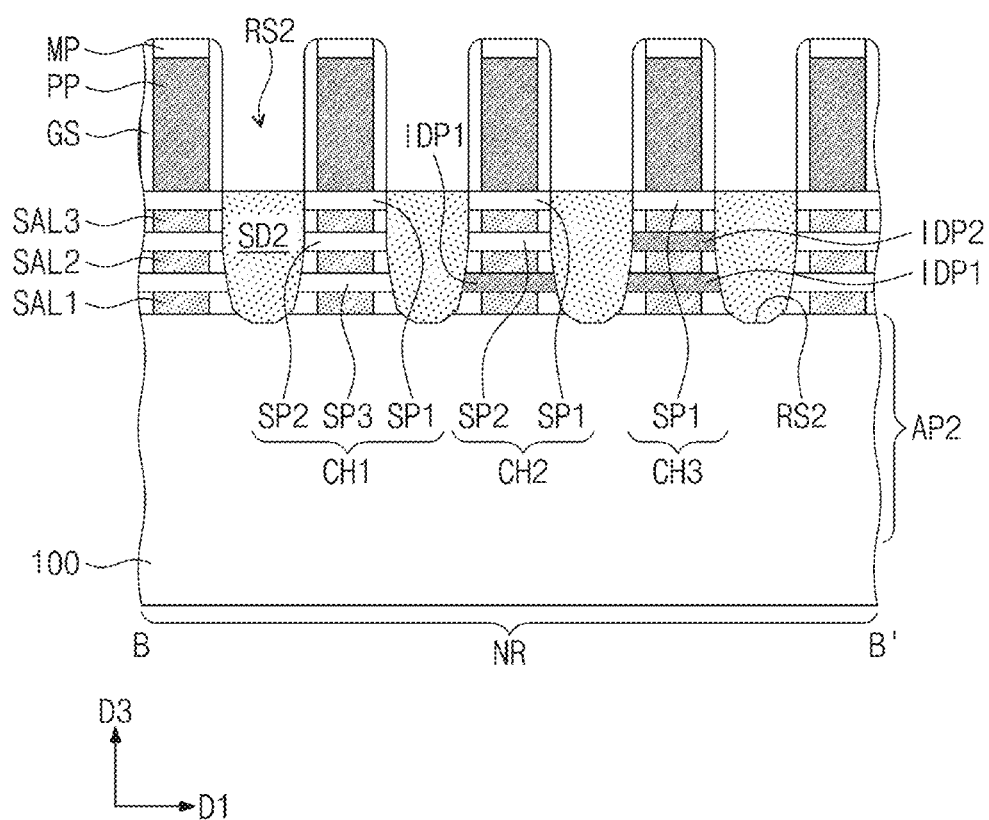
Figure 10C:
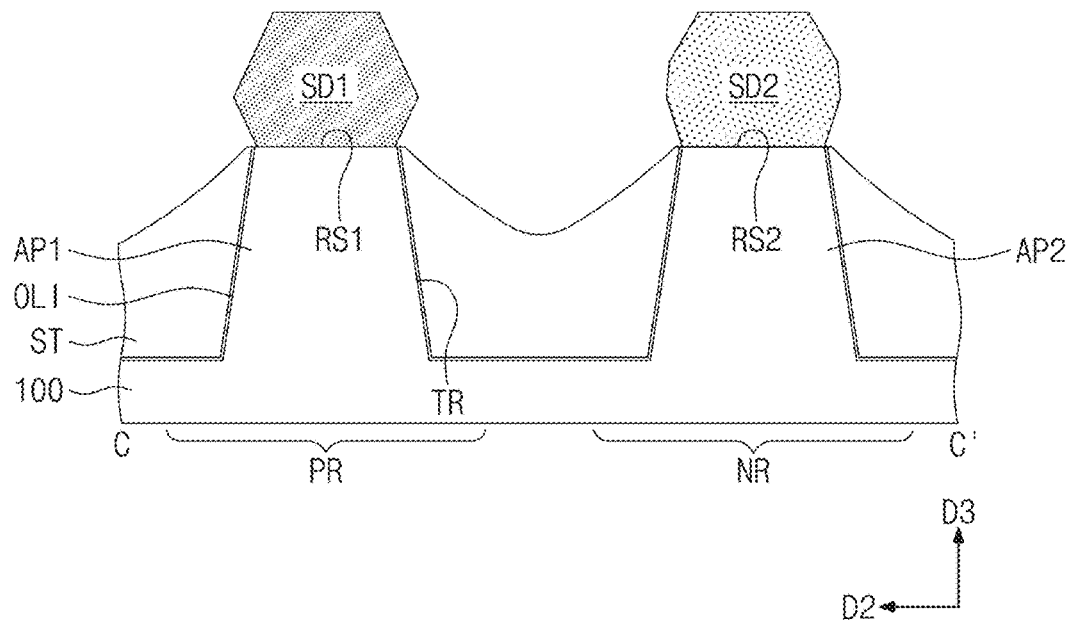
Figure 10D:
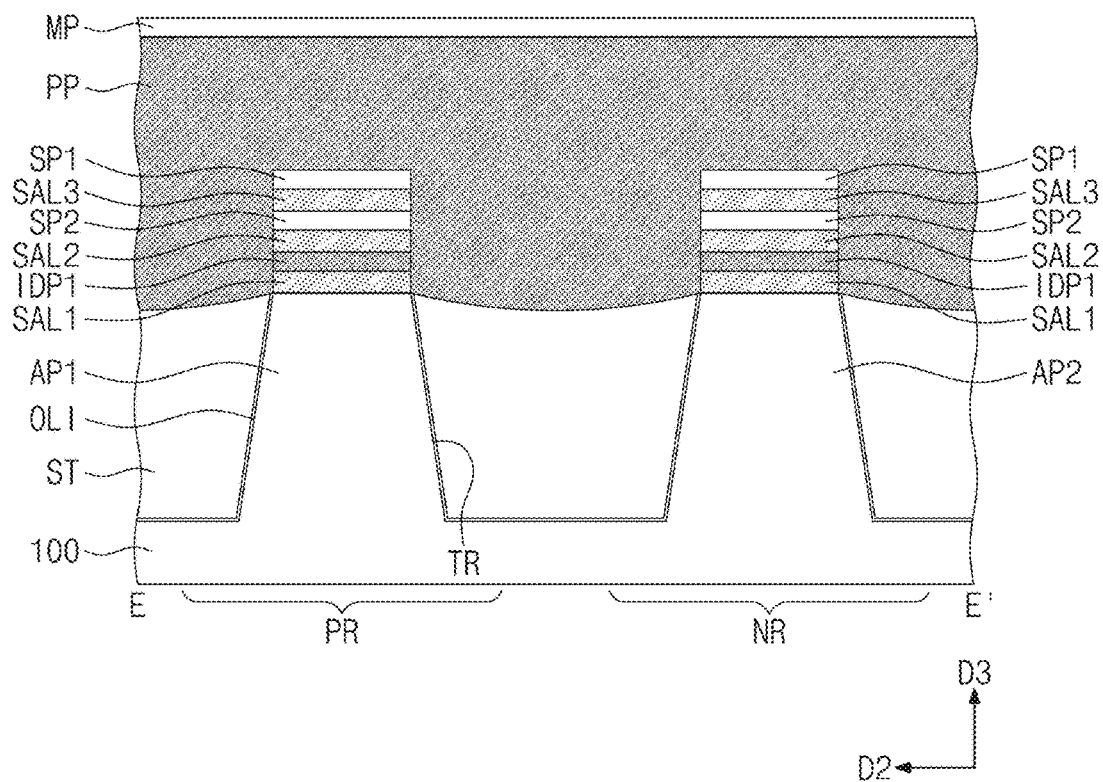
Figure 11A:
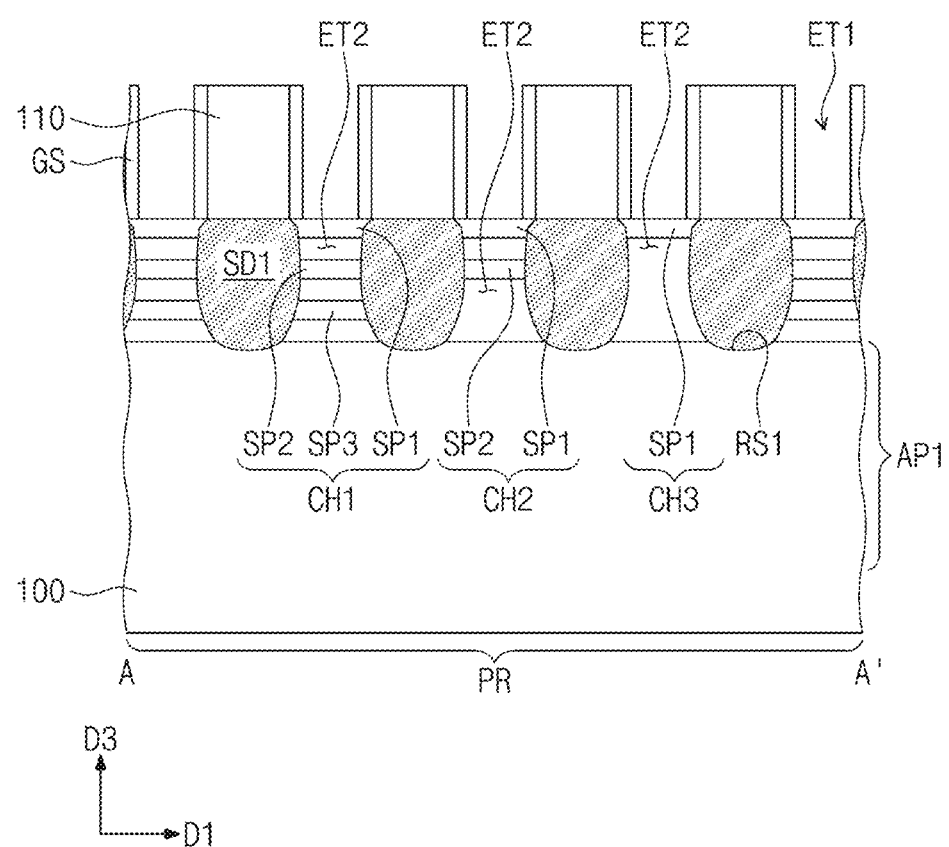
Figure 11B:
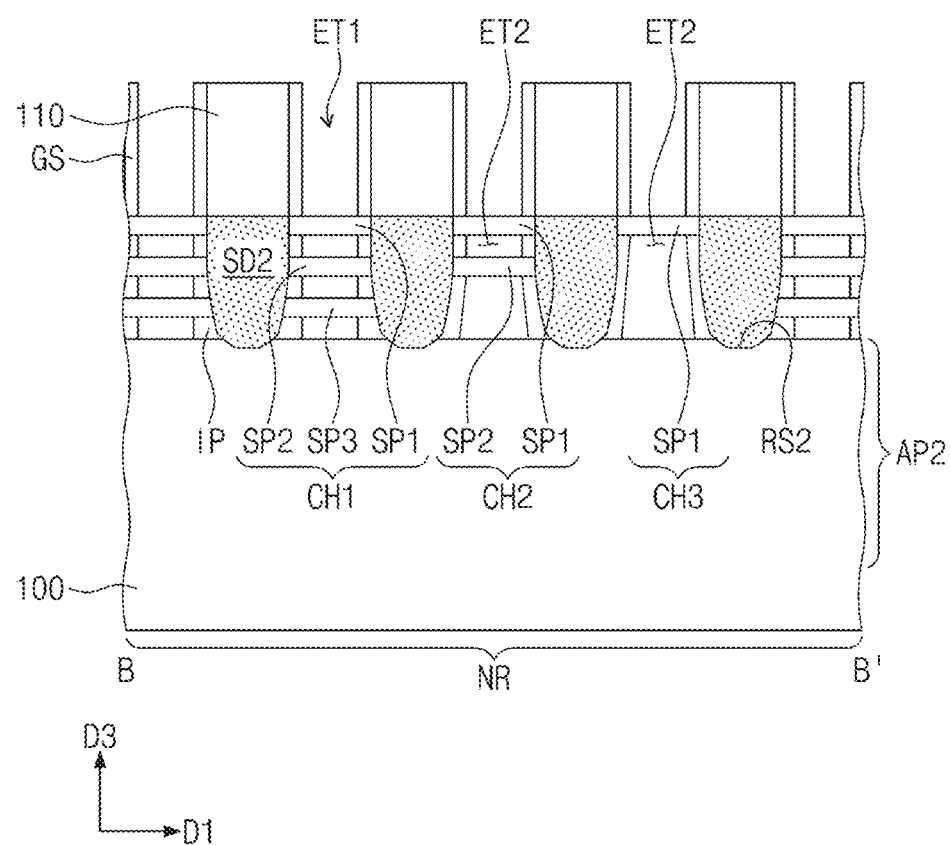
Figure 11C:
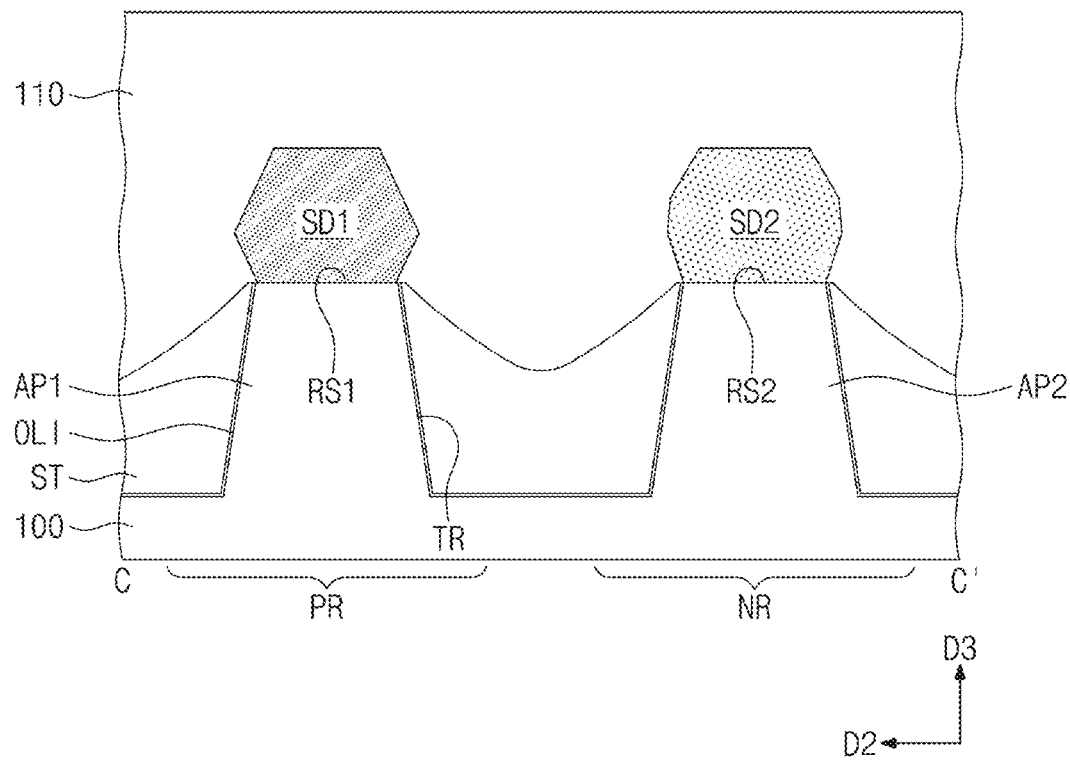
Figure 11D:
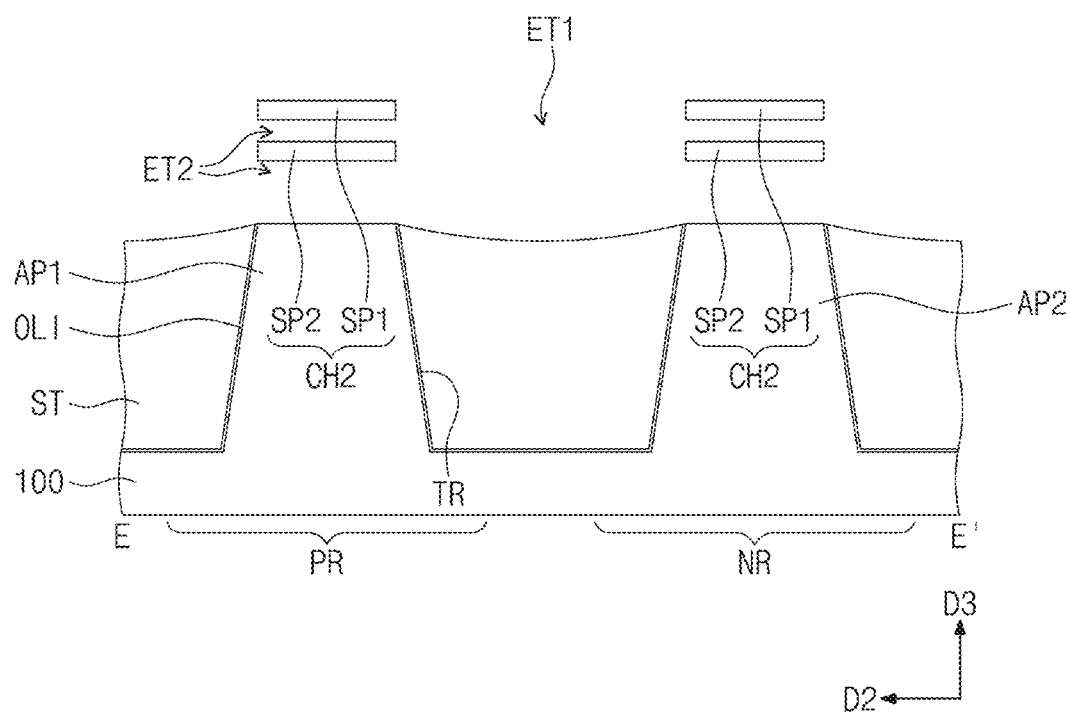
Figure 12A:
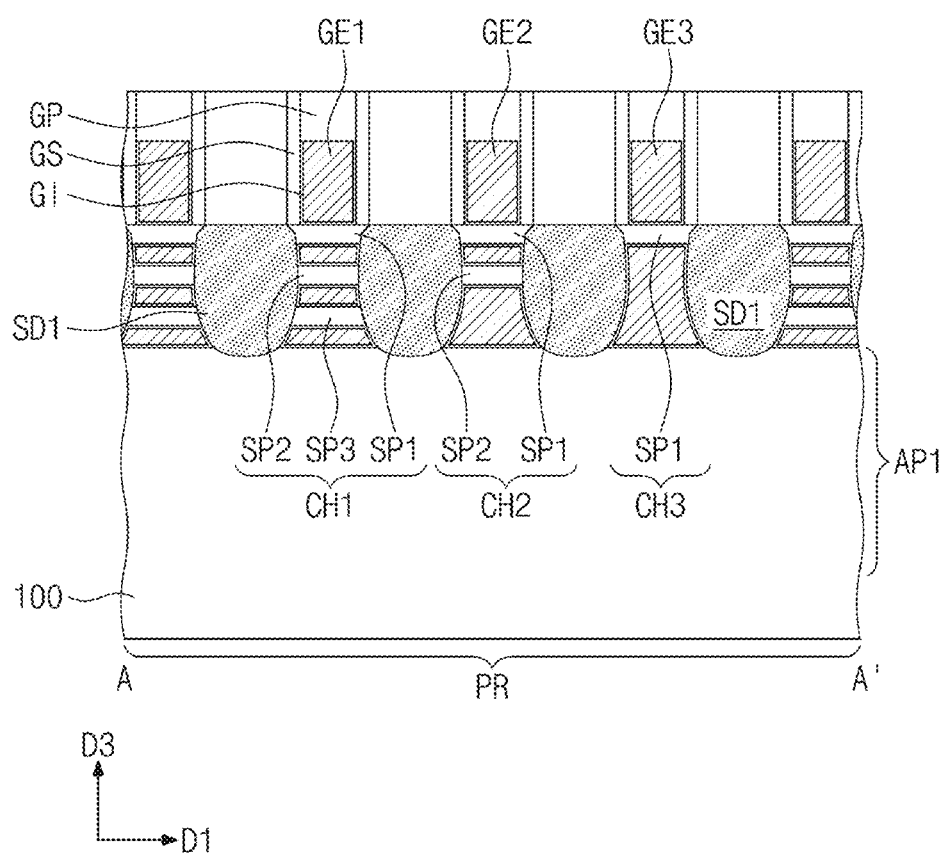
Figure 12B:
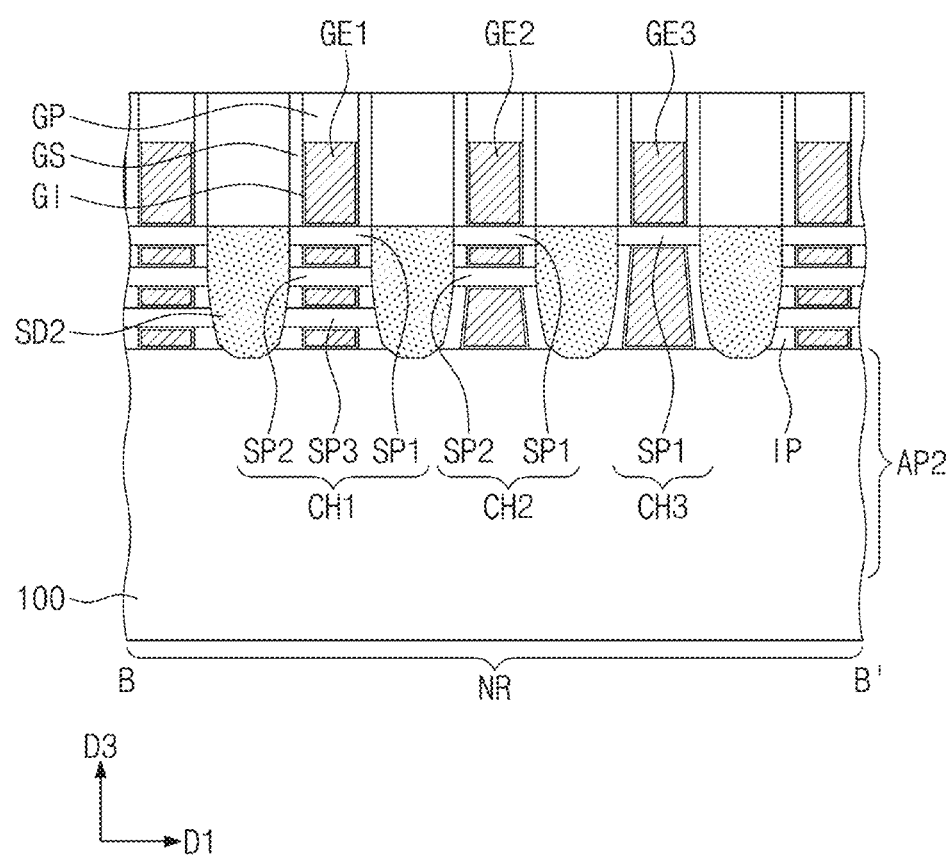
Figure 12C:
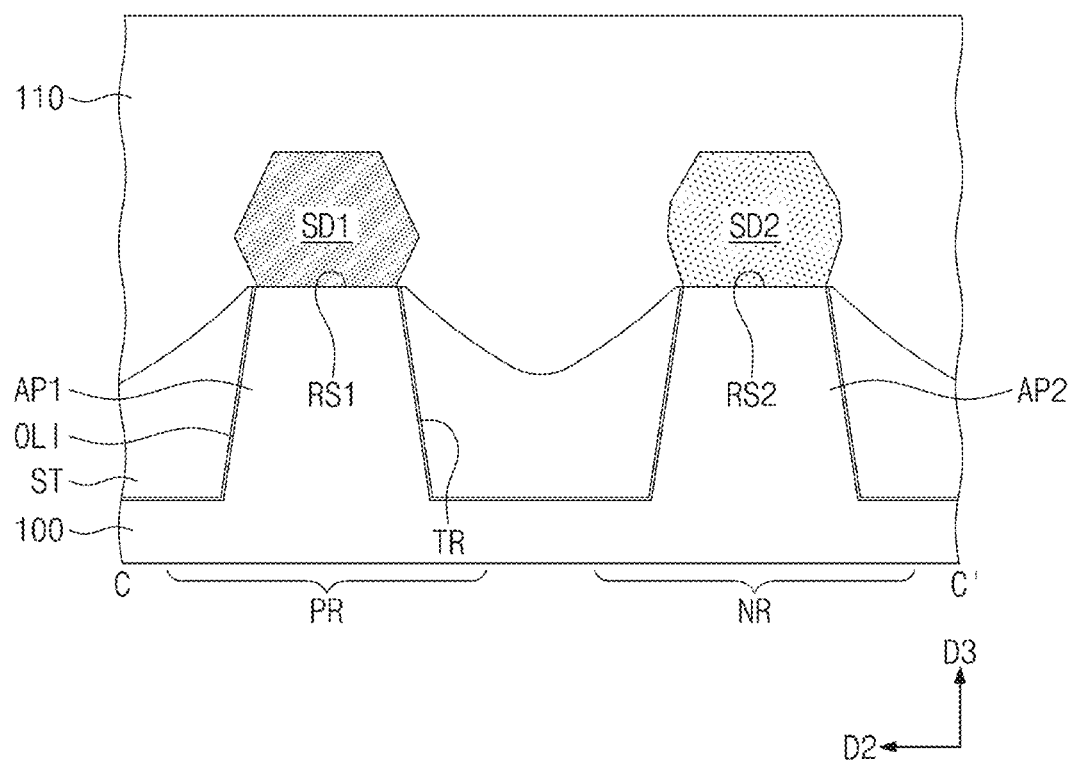
Figure 12D:
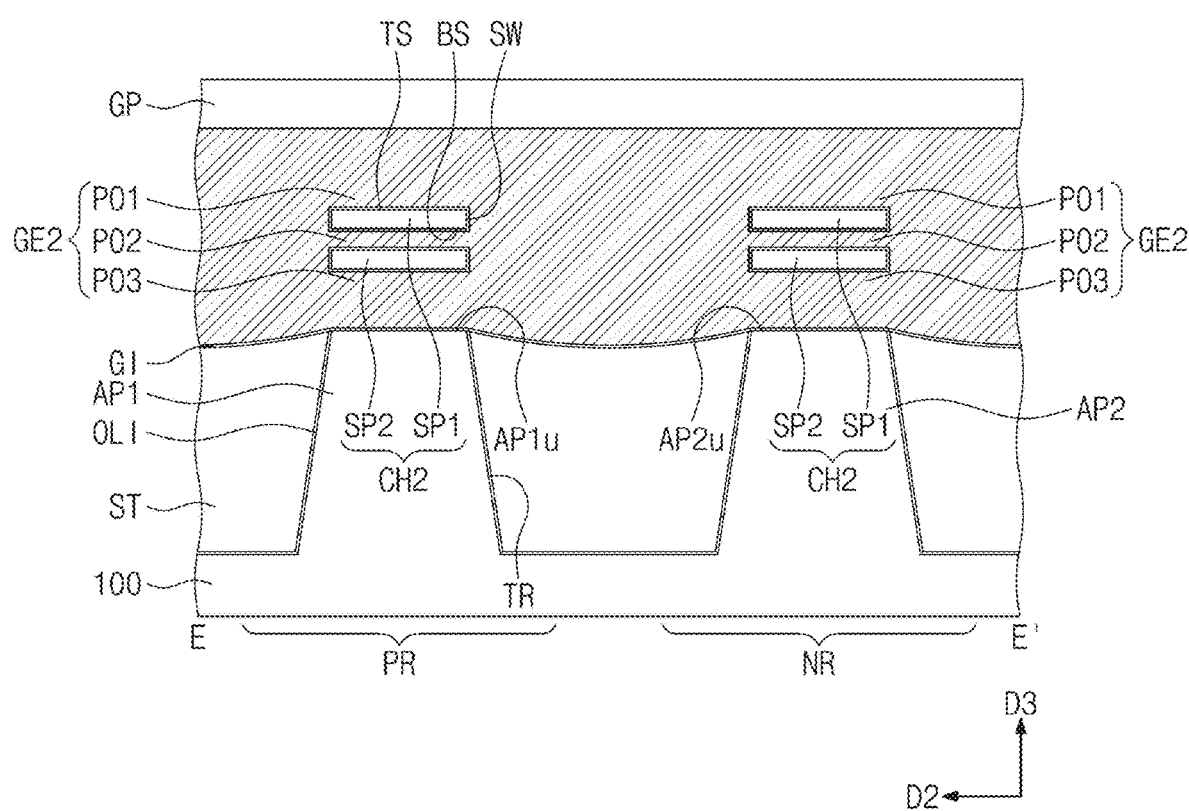

Referring to FIGS. 8A and 8B, a device isolation layer ST filling the trench TR may be formed. For example, an insulating layer covering the first and second active patterns AP1 and AP2 and the stack patterns STP may be formed on an entire top surface of the substrate 100. The insulating layer may be recessed until the stack patterns STP are exposed, thereby forming the device isolation layer ST. The device isolation layer ST may be formed with a CVD process and/or with a spin-on-dielectric (SOD) process; however, example embodiments are not limited thereto.

The device isolation layer ST may include an insulating material such as a silicon oxide layer. The stack patterns STP may not be covered by the device isolation layer ST. In other words, the stack patterns STP may vertically protrude above the device isolation layer ST. The liner layer OLI on the stack patterns STP may be partially removed.

Subsequently, sacrificial patterns PP intersecting the stack patterns STP may be formed on the substrate 100. Each of the sacrificial patterns PP may be formed to have a line shape or bar shape extending in the second direction D2. The sacrificial patterns PP may be arranged at a particular (e.g. predetermined and/or variably determined) pitch in the first direction D1.

For example, the formation of the sacrificial patterns PP may include forming a sacrificial layer on an entire top surface of the substrate 100, forming hard mask patterns MP on the sacrificial layer, and patterning the sacrificial layer using the hard mask patterns MP as etch masks. The sacrificial layer may include doped or undoped polysilicon.

A pair of gate spacers GS may be formed on both sidewalls of each of the sacrificial patterns PP, respectively. The formation of the gate spacers GS may include conformally forming a gate spacer layer on an entire top surface of the substrate 100 and anisotropically etching the gate spacer layer. For example, the gate spacer layer may include at least one of SiCN, SiCON, or SiN. In some example embodiments, the gate spacer layer may be formed of a multi-layer including at least two of SiCN, SiCON, or SiN. The first ion implantation pattern IDP1 and the second ion implantation pattern IDP2 may be located between a pair of the sacrificial patterns PP adjacent to each other in the first direction D1 when viewed in a plan view. For example, the first ion implantation pattern IDP1 and the second ion implantation pattern IDP2 may vertically overlap with a space between at least a pair of the sacrificial patterns PP. Alternatively or additionally, at least one of the sacrificial patterns PP may vertically overlap with the first ion implantation pattern IDP1 and the second ion implantation pattern IDP2.

Referring to FIGS. 9A to 9D, first recesses RS1 may be formed in the stack pattern STP provided on the first active pattern AP1. Second recesses RS2 may be formed in the stack pattern STP provided on the second active pattern AP2. The device isolation layer ST at both sides of each of the first and second active patterns AP1 and AP2 may be further recessed during the formation of the first and second recesses RS1 and RS2 (see FIG. 9C).

For example, the stack pattern STP on the first active pattern AP1 may be etched using the hard mask patterns MP and the gate spacers GS as etch masks to form the first recesses RS1. The first recess RS1 may be formed between a pair of the sacrificial patterns PP. The second recesses RS2 in the stack pattern STP on the second active pattern AP2 may be formed by the same method as the first recesses RS1.

First to third channel structures CH1, CH2 and CH3 may be formed between the first recesses RS1. The first channel structure CH1 may include first to third semiconductor layers (or semiconductor patterns) SP1, SP2, and SP3. The second channel structure CH2 may include first and second semiconductor layers (or semiconductor patterns) SP1 and SP2. The third channel structure CH3 may include a first semiconductor layer (or semiconductor pattern) SP1. The second channel structure CH2 may be formed on one of the first ion implantation patterns IDP1. The third channel structure CH3 may be formed on the second ion implantation pattern IDP2 and another of the first ion implantation patterns IDP1. The first ion implantation pattern IDP1 may be located at the same level as the third semiconductor layer SP3 of the first channel structure CH1, and the second ion implantation pattern IDP2 may be located at the same level as the second semiconductor layers SP2 of the first and second channel structures CH1 and CH2.

Referring to FIGS. 10A to 10D, first source/drain patterns SD1 may be formed in the first recesses RS1, respectively. Each of the first source/drain patterns SD1 may include a first sub-semiconductor pattern covering an inner surface of the first recess RS1, and a second sub-semiconductor pattern filling a remaining portion of the first recess RS1. For example, a first SEG process may be performed using the inner surface of the first recess RS1 as a seed layer to form the first sub-semiconductor pattern filling a portion of the first recess RS1. The first sub-semiconductor pattern may be grown, e.g. epitaxially grown, using the first to third semiconductor layers SP1, SP2 and SP3 and the substrate 100, which are exposed by the first recess RS1, as a seed. For example, the first SEG process may include a chemical vapor deposition (CVD) process and/or a molecular beam epitaxy (MBE) process.

The first sub-semiconductor pattern may include a semiconductor element (e.g., SiGe) of which a lattice constant is greater than that of a semiconductor element of the substrate 100. The first sub-semiconductor pattern may contain a relatively low concentration of germanium (Ge). In some example embodiments, the first sub-semiconductor pattern may contain only silicon (Si) except germanium (Ge). The concentration of germanium (Ge) in the first sub-semiconductor pattern may range from 0 at % to 10 at %.

A second SEG process may be performed on the first sub-semiconductor pattern to form the second sub-semiconductor pattern. The second sub-semiconductor pattern may be formed to completely fill a remaining portion of the first recess RS1. The second sub-semiconductor pattern may contain a relatively high concentration of germanium (Ge). For example, the concentration of germanium (Ge) in the second sub-semiconductor pattern may range from 30 at % to 70 at %.

The first and second sub-semiconductor patterns may constitute the first source/drain pattern SD1. In some example embodiments, dopants may be injected in-situ during the first and second SEG processes. Alternatively or additionally in some example embodiments, the dopants may be injected and/or implanted into the first source/drain patterns SD1 after the formation of the first source/drain patterns SD1. The first source/drain patterns SD1 may be doped with the dopants to have a first conductivity type (e.g., a P-type).

Second source/drain patterns SD2 may be formed in the second recesses RS2, respectively. For example, the second source/drain pattern SD2 may be formed by performing a SEG process using an inner surface of the second recess RS2 as a seed layer. For example, the second source/drain patterns SD2 may include the same semiconductor element (e.g., silicon) as the substrate 100. The second source/drain patterns SD2 may be doped with dopants to have a second conductivity type (e.g., an N-type). Inner spacers IP may be formed between the second source/drain pattern SD2 and the sacrificial layers SAL1, SAL2 and SAL3, respectively.

Referring to FIGS. 10A to 10D and 11A to 11D, a first interlayer insulating layer 110 may be formed to cover the first and second source/drain patterns SD1 and SD2, the hard mask patterns MP, and the gate spacers GS. The first interlayer insulating layer 110 may include, for example, a silicon oxide layer.

The first interlayer insulating layer 110 may be planarized until top surfaces of the sacrificial patterns PP are exposed. The planarization process of the first interlayer insulating layer 110 may be performed using an etch-back process and/or a chemical mechanical polishing (CMP) process. The hard mask patterns MP may be completely removed during the planarization process. As a result, a top surface of the first interlayer insulating layer 110 may be substantially coplanar with the top surfaces of the sacrificial patterns PP and top surfaces of the gate spacers GS.

The exposed sacrificial patterns PP may be selectively removed. First empty spaces ET1 respectively exposing the first to third channel structures CH1, CH2, and CH3 may be formed by the removal of the sacrificial patterns PP.

The sacrificial layers SAL1, SAL2 and SAL3 and the ion implantation patterns IDP1 and IDP2, which are exposed through the first empty spaces ET1, may be selectively removed to form second empty spaces ET2. For example, an etching process of selectively etching the sacrificial layers SAL1, SAL2 and SAL3 and the ion implantation patterns IDP1 and IDP2 may be performed. The first to third semiconductor layers SP1, SP2 and SP3 may remain after the etching process. The etching process may have a high etch rate with respect to silicon-germanium having a relatively high germanium concentration. For example, the etching process may have a high etch rate with respect to silicon-germanium having a germanium concentration greater than 10 at %.

The sacrificial layers SAL1, SAL2 and SAL3 and the ion implantation patterns IDP1 and IDP2 on the PMOSFET region PR and the NMOSFET region NR may be removed during the etching process. The etching process may be a wet etching process. An etchant used in the etching process may quickly remove the sacrificial layers SAL1, SAL2 and SAL3 having a relatively high germanium concentration. Meanwhile, during the etching process, the first source/drain pattern SD1 on the PMOSFET region PR may be protected by the first sub-semiconductor pattern having the relatively low germanium concentration.

Since the ion implantation patterns IDP1 and IDP2 are removed together with the sacrificial layers SAL1, SAL2, and SAL3, the first to third semiconductor layers SP1, SP2 and SP3 may remain on each of the first and second active patterns AP1 and AP2. The second empty spaces ET2 may be formed by the removal of the ion implantation patterns IDP1 and IDP2 and the sacrificial layers SAL1, SAL2, and SAL3. The second empty spaces ET2 may be defined between the channel structures CH1, CH2 and CH3 and the active patterns AP1 and AP2 and between the first to third semiconductor layers SP1, SP2 and SP3. The second empty space ET2 between a bottom surface of the second channel structure CH2 and the active pattern AP1 or AP2 may include spaces, which are formed by the removal of the first ion implantation pattern IDP1 and the first and second sacrificial layers SAL1 and SAL2 and are connected to each other, and thus may have a size greater than those of other second empty spaces ET2. Alternatively or additionally, the second empty space ET2 between a bottom surface of the third channel structure CH3 and the active pattern AP1 or AP2 may include spaces, which are formed by the removal of the first and second ion implantation patterns IDP1 and IDP2 and the first to third sacrificial layers SAL1, SAL2 and SAL3 and are connected to each other, and thus may have a size greater than those of other second empty spaces ET2.

Referring to FIGS. 12A to 12D, a gate insulating layer GI may be conformally formed in the first and second empty spaces ET1 and ET2. Gate electrodes GE1, GE2 and GE3 may be formed on the gate insulating layer GI. The gate electrodes GE1, GE2 and GE3 may be formed to fill the first and second empty spaces ET1 and ET2. More particularly, the gate electrodes GE1, GE2 and GE3 may include second to fourth portions PO2, PO3 and PO4 filling the second empty spaces ET2. The gate electrodes GE1, GE2 and GE3 may further include first portions PO1 filling the first empty spaces ET1. Gate capping patterns GP may be formed on the gate electrodes GE1, GE2, and GE3, respectively.

Referring again to FIGS. 1 and 2A to 2E, a second interlayer insulating layer 120 may be formed on the first interlayer insulating layer 110. The second interlayer insulating layer 120 may include a silicon oxide layer. Active contacts AC may be formed in the second and first interlayer insulating layers 120 and 110. The active contacts AC may penetrate the second and first interlayer insulating layers 120 and 110 so as to be electrically connected to the first and second source/drain patterns SD1 and SD2. At least one gate contact GC may be formed. The gate contact GC may penetrate the second interlayer insulating layer 120 and the gate capping pattern GP so as to be electrically connected to one of the gate electrodes GE1, GE2 and GE3.

Separation structures DB may be formed on the substrate 100. The separation structures DB may penetrate the second interlayer insulating layer 120 and dummy gate electrodes provided at both sides of the gate electrodes GE1 to GE3 and may extend into the active patterns AP1 and AP2. The separation structures DB may include an insulating material such as silicon oxide or silicon nitride.

A third interlayer insulating layer 130 may be formed on the active contacts AC and the gate contacts GC. A first metal layer M1 may be formed in the third interlayer insulating layer 130. The formation of the first metal layer M1 may include forming first vias VI1 and first interconnection lines M1W by at least one damascene process. In some embodiments, the first vias VI1 and the first interconnection lines M1W may be formed using single damascene processes. A fourth interlayer insulating layer 140 may be formed on the third interlayer insulating layer 130. A second metal layer M2 may be formed in the fourth interlayer insulating layer 140. The formation of the second metal layer M2 may include forming second vias VI2 and second interconnection lines M2W. In some embodiments, the second vias VI2 and the second interconnection lines M2W may be formed by the same process. The second via VI2 and the second interconnection line M2W may be connected to each other to constitute one body.

According to the some example embodiments of inventive concepts, the channel structures on the active pattern may include various numbers of semiconductor layers, and the level of the bottom surface of each of the channel structures may be changed depending on the number of the semiconductor layer(s) included therein. Thus, electrical characteristics of the semiconductor device may be improved, and the operating voltage and/or power consumption of the semiconductor device may be reduced.

While inventive concepts have been described with reference to example embodiments, it will be apparent to those of ordinary skill in the art that various changes and modifications may be made without departing from the spirits and scopes of the inventive concepts. Therefore, it should be understood that example embodiments are not limiting, but illustrative. Furthermore example embodiments described above are not necessarily mutually exclusive. For example, some example embodiments may include some features described with reference to one or more figures, and may also include other features described with reference to one or more other figures. Thus, the scopes of the inventive concepts are to be determined by the broadest permissible interpretation of the following claims and their equivalents, and shall not be restricted or limited by the foregoing description.

What is claimed is:

1. A semiconductor device comprising:
   an active pattern on a substrate;
   a plurality of source/drain patterns on the active pattern and arranged in a first direction;
   a first channel structure between a pair of source/drain patterns of the plurality of source/drain patterns;
   a second channel structure between another pair of source/drain patterns of the plurality of source/drain patterns;
   a first gate electrode intersecting the first channel structure and extending in a second direction perpendicular to the first direction; and
   a second gate electrode intersecting the second channel structure and extending in the second direction,
   wherein the first gate electrode includes a first portion between a bottom surface of the first channel structure and a top surface of the active pattern, and the second gate electrode includes a first portion between a bottom surface of the second channel structure and the top surface of the active pattern, and a thickness of the first portion of the second gate electrode is greater than a thickness of the first portion of the first gate electrode.

2. The semiconductor device of claim 1, wherein
the first channel structure comprises a plurality of semiconductor patterns stacked vertically, and
a top surface of the first portion of the second gate electrode is at a higher level than a top surface of a lowermost semiconductor pattern of the plurality of semiconductor patterns.

3. The semiconductor device of claim 1, wherein
the first channel structure comprises a plurality of semiconductor patterns stacked vertically, and
a bottom surface of the first portion of the second gate electrode is at a lower level than a bottom surface of a lowermost semiconductor pattern of the semiconductor patterns.

4. The semiconductor device of claim 1, wherein the first portion of the second gate electrode has a width in the first direction which decreases as a distance from a top surface of the active pattern increases.

5. The semiconductor device of claim 1, further comprising:
an active contact connected to one of the plurality of source/drain patterns,
wherein a top surface of the first portion of the second gate electrode is at a higher level than a bottom surface of the active contact.

6. The semiconductor device of claim 1, wherein a bottom surface of the first portion of the first gate electrode is at the same level as a bottom surface of the first portion of the second gate electrode.

7. The semiconductor device of claim 1, wherein
each of the first and second channel structures comprises a plurality of semiconductor patterns stacked vertically, and
the number of the semiconductor patterns of the first channel structure is more than the number of the semiconductor patterns of the second channel structure.

8. The semiconductor device of claim 1, wherein
each of the first and second channel structures comprises a plurality of semiconductor patterns stacked vertically, and
an uppermost semiconductor pattern of the semiconductor patterns of the first channel structure is at the same level as an uppermost semiconductor pattern of the semiconductor patterns of the second channel structure.

9. The semiconductor device of claim 1, further comprising:
an inner spacer between a sidewall of the first portion of the second gate electrode and the source/drain pattern,
wherein the first channel structure comprises a plurality of semiconductor patterns stacked vertically, and a top surface of the inner spacer is at a higher level than a top surface of a lowermost semiconductor pattern of the plurality of semiconductor patterns.

10. The semiconductor device of claim 1, wherein a number of semiconductor patterns between a top surface and a bottom surface of the second gate electrode in the second channel structure is one.

11. A semiconductor device comprising:
an active pattern on a substrate and extending in a first direction;
a first channel structure on the active pattern and comprising a plurality of semiconductor patterns vertically stacked;
a second channel structure on the active pattern and apart from the first channel structure in the first direction;
a source/drain pattern between the first channel structure and the second channel structure;
a first gate electrode intersecting the first channel structure and extending in a second direction perpendicular to the first direction; and
a second gate electrode intersecting the second channel structure and extending in the second direction, the second gate electrode including a first portion between a bottom surface of the second channel structure and a top surface of the active pattern,
wherein a top surface of the first portion is at a higher level than a top surface of a lowermost semiconductor pattern of the plurality of semiconductor patterns.

12. The semiconductor device of claim 11, wherein a bottom surface of the first portion is at a lower level than a bottom surface of the lowermost semiconductor pattern of the plurality of semiconductor patterns.

13. The semiconductor device of claim 11, wherein
the first gate electrode includes a first portion between a bottom surface of the first channel structure and the top surface of the active pattern, and
a thickness of the first portion of the second gate electrode is greater than a thickness of the first portion of the first gate electrode.

14. The semiconductor device of claim 11, wherein the first portion of the second gate electrode has a width in the first direction which decreases as a distance from the top surface of the active pattern increases.

15. The semiconductor device of claim 11, further comprising:
an active contact connected to the source/drain pattern,
wherein the top surface of the first portion of the second gate electrode is at a higher level than a bottom surface of the active contact.

16. The semiconductor device of claim 11, further comprising:
an inner spacer between a sidewall of the first portion and the source/drain pattern,
wherein a top surface of the inner spacer is at a higher level than the top surface of the lowermost semiconductor pattern of the plurality of semiconductor patterns.

17. A semiconductor device comprising:
an active pattern on a substrate and extending in a first direction;
a plurality of source/drain patterns arranged in the first direction on the active pattern;
a first channel structure between a pair of source/drain patterns of the plurality of source/drain patterns, the first channel structure comprising a plurality of semiconductor layers stacked vertically;
a second channel structure between another pair of source/drain patterns of the plurality of source/drain patterns, the second channel structure comprising a plurality of semiconductor layers stacked vertically;
a first gate electrode intersecting the first channel structure and extending in a second direction perpendicular to the first direction;
a second gate electrode intersecting the second channel structure and extending in the second direction;

a gate insulating layer between the first channel structure and the first gate electrode and between the second channel structure and the second gate electrode;

gate capping patterns on top surfaces of the first and second gate electrodes, respectively;

a first interlayer insulating layer on the gate capping patterns;

active contacts penetrating the first interlayer insulating layer and connected to the source/drain patterns, respectively;

a second interlayer insulating layer on the first interlayer insulating layer; and interconnection lines in the second interlayer insulating layer and connected to the active contacts, wherein a lowermost semiconductor layer of the semiconductor layers of the first channel structure has a first length in the first direction, and a lowermost semiconductor layer of the semiconductor layers of the second channel structure has a second length in the first direction, which is less than the first length.

18. The semiconductor device of claim 17, wherein the first gate electrode includes a first portion between a bottom surface of the first channel structure and a top surface of the active pattern, and the second gate electrode includes a first portion between a bottom surface of the second channel structure and the top surface of the active pattern, and a thickness of the first portion of the second gate electrode is greater than a thickness of the first portion of the first gate electrode.

19. The semiconductor device of claim 17, wherein the second gate electrode includes a first portion between a bottom surface of the second channel structure and a top surface of the active pattern, and a top surface of the first portion is at a higher level than a top surface of the lowermost semiconductor layer of the semiconductor layers of the first channel structure.

20. The semiconductor device of claim 17, wherein the number of the semiconductor layers of the first channel structure is more than the number of the semiconductor layers of the second channel structure.

* * * * *